(12) United States Patent
Ichiba et al.

(10) Patent No.: US 6,546,048 B1
(45) Date of Patent: Apr. 8, 2003

(54) PULSE WIDTH MODULATION WAVEFORM GENERATING CIRCUIT

(75) Inventors: Fuyuki Ichiba, Yokohama (JP); Kojiro Suzuki, Kawasaki (JP); Fumitoshi Hatori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/372,720

(22) Filed: Aug. 11, 1999

(30) Foreign Application Priority Data

Aug. 11, 1998 (JP) .......................................... 10-227103
Aug. 26, 1998 (JP) .......................................... 10-240358

(51) Int. Cl.⁷ ............................. H03K 7/08; H03K 9/08
(52) U.S. Cl. ..................................... 375/238; 332/109
(58) Field of Search .......................... 375/238; 332/109, 332/110, 111; 327/172, 173, 174, 175, 177, 176

(56) References Cited

U.S. PATENT DOCUMENTS

| | | | |
|---|---|---|---|
| 4,502,024 A | * | 2/1985 | Nishikawa et al. .......... 332/109 |
| 5,119,045 A | * | 6/1992 | Sato ............................ 332/109 |
| 5,880,644 A | * | 3/1999 | Schmidt et al. .............. 332/109 |
| 6,023,199 A | * | 2/2000 | Cheung ........................ 332/109 |
| 6,310,913 B1 | * | 10/2001 | Ishikawa ..................... 375/238 |

OTHER PUBLICATIONS

Abram Dancy et al.; Proceedings of the IEEE 1997 Custom Integrated Circuits Conference; pp. 579–586; "Techniques for Aggressive Supply Voltage Scaling and Efficient Regulation"; May 5, 1997.
U.S. patent application Ser. No. 09/042,196, U.S. patent 6,059,329.

* cited by examiner

Primary Examiner—Phuong Phu
(74) Attorney, Agent, or Firm—Hogan & Hartson, LLP

(57) ABSTRACT

An object of the present invention to provide a pulse width modulation waveform generating circuit that it is possible to reduce circuit size and power consumption. A pulse width modulation waveform generating circuit comprises a ring oscillator having 64 pieces of inverters connected in series, inverters connected to output terminals of odd numbered stages of inverters in the ring oscillator, a multiplexer, a change detecting circuit, and an RS flip-flop. The multiplexer is supplied with output signals of even numbered stages of the inverters in the ring oscillator and output signal of the inverter. One of their signals is selected in accordance with logic of a digital signal. The RS flip-flop is set at time an edge detecting pulse is outputted from the change detecting circuit, and is reset at time an edge detecting pulse is outputted from the change detecting circuit.

22 Claims, 16 Drawing Sheets

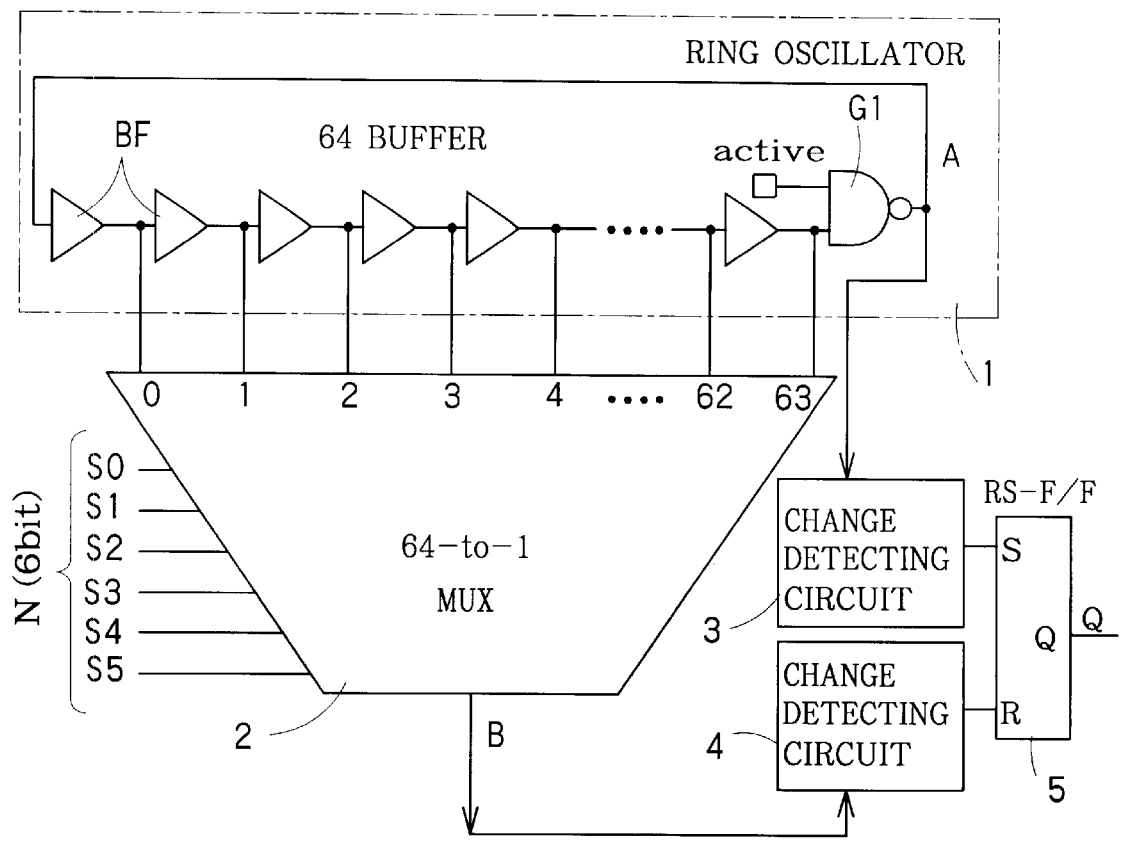
F I G. 1

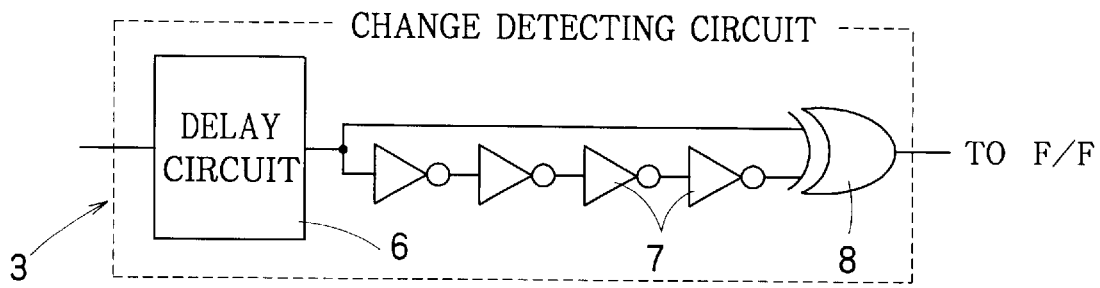
F I G. 3a
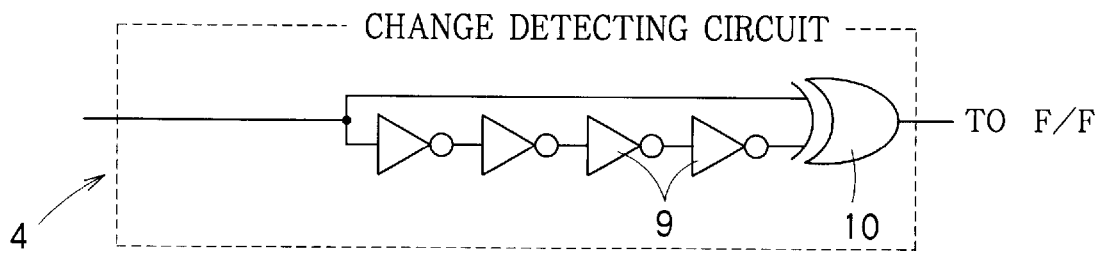
F I G. 3b
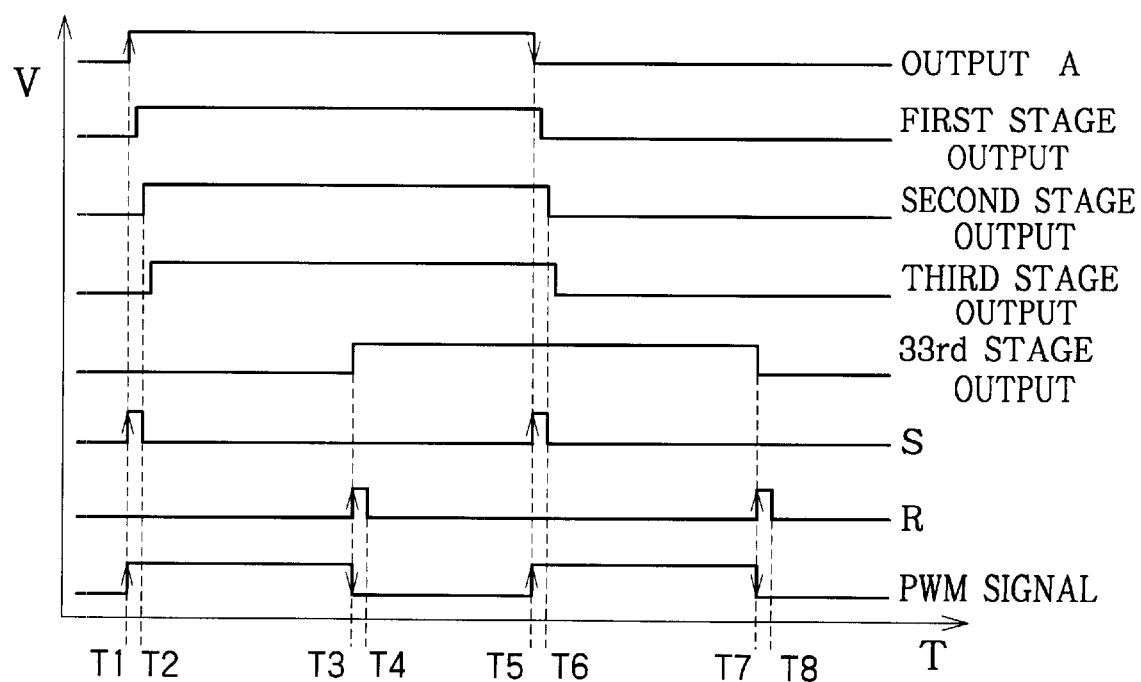
F I G. 4

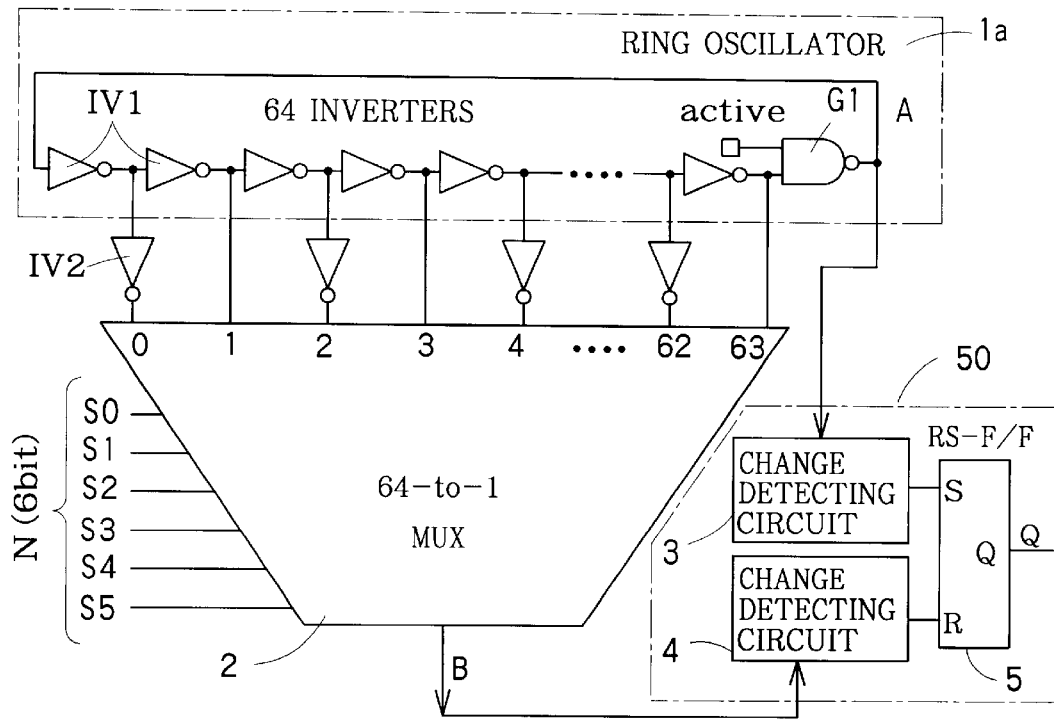
F I G. 5
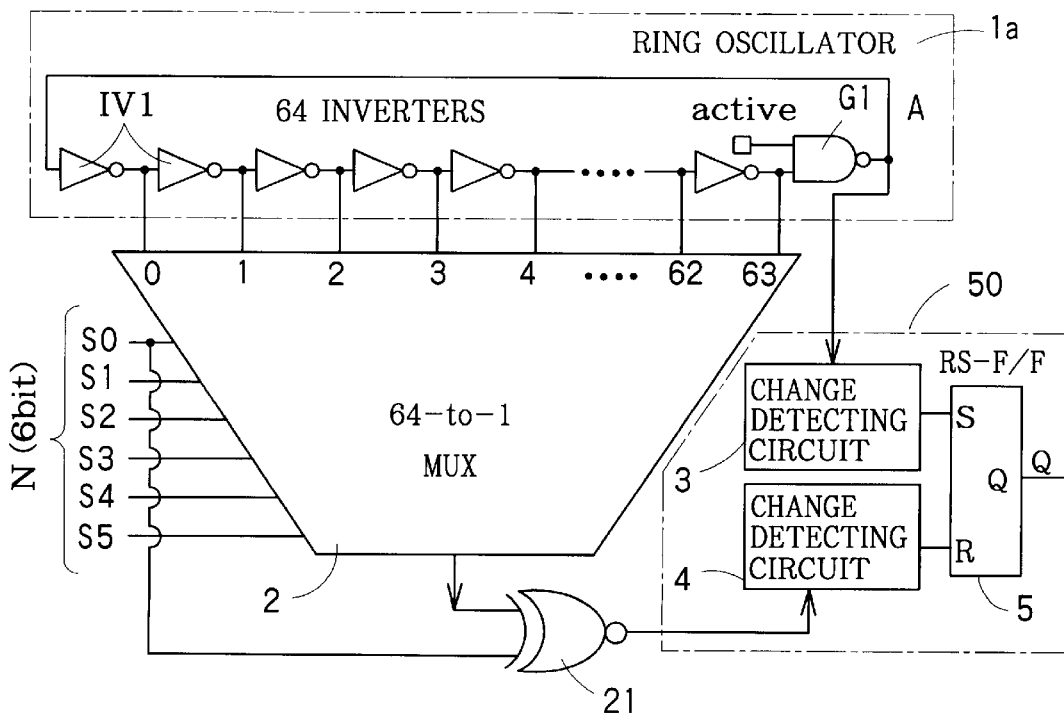
F I G. 6

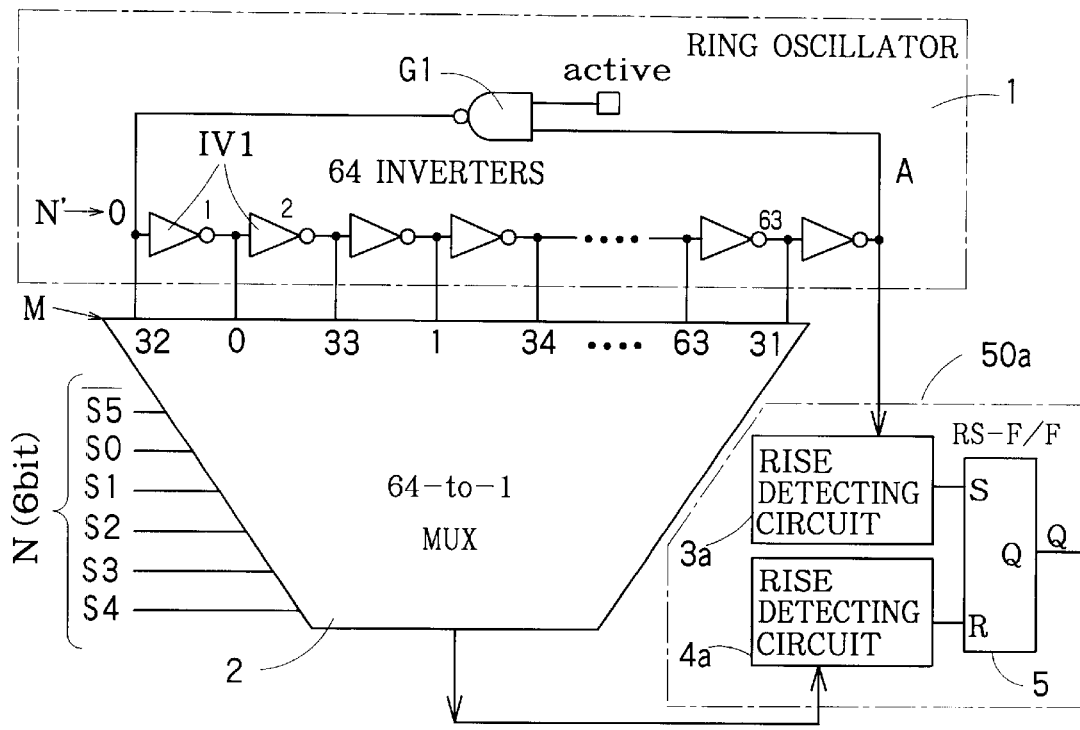
F I G. 7
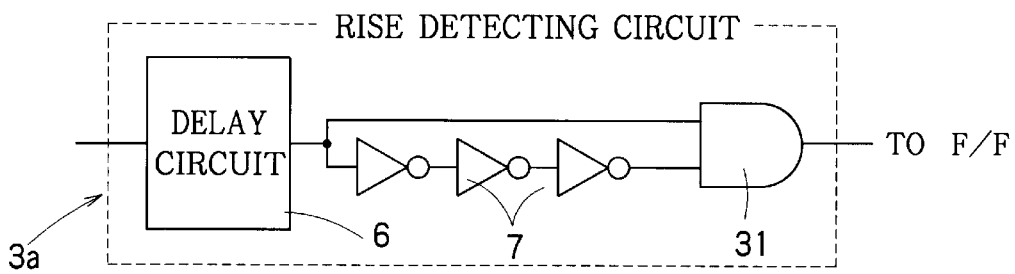
F I G. 8a
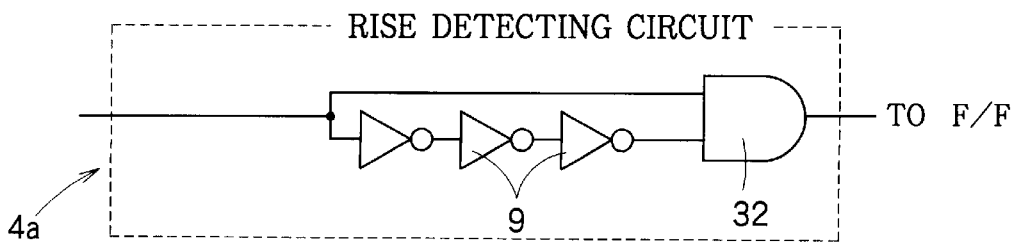
F I G. 8b

| STAGE NUMBER | 0 | 1 | 2 | 3 | 4 | ... | 28 | 29 | 30 | 31 |
|---|---|---|---|---|---|---|---|---|---|---|
| RISE | 32 | 1 | 34 | 3 | 36 | ... | 60 | 29 | 62 | 31 |
| FALL | 0 | 33 | 2 | 35 | 4 | ... | 28 | 61 | 30 | 63 |
FIG. 11
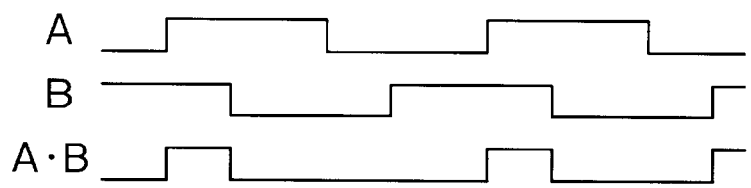
FIG. 12a
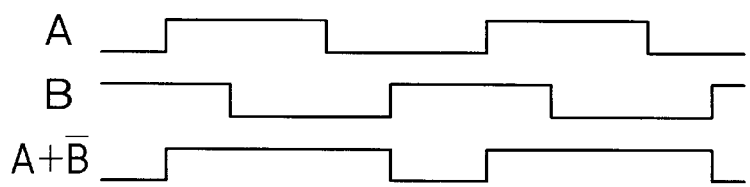
FIG. 12b
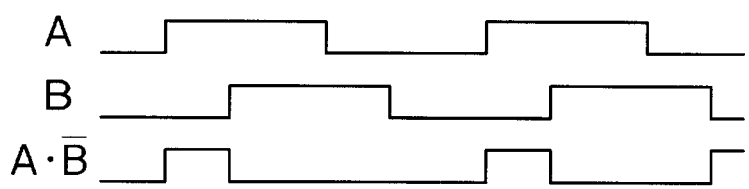
FIG. 12c
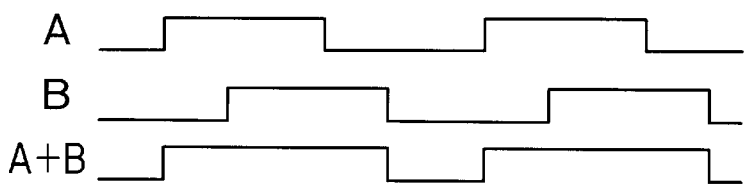
FIG. 12d

| | S0 | S5 | A | B | OUTPUT | |
|---|---|---|---|---|---|---|
| (i) | 0 | 0 | 0 | 0 | 0 | A·B |
| | | | 0 | 1 | 0 | |
| | | | 1 | 0 | 0 | |
| | | | 1 | 1 | 1 | |
| (ii) | 0 | 1 | 0 | 0 | 1 | $A+\bar{B}$ |
| | | | 0 | 1 | 0 | |
| | | | 1 | 0 | 1 | |
| | | | 1 | 1 | 1 | |
| (iii) | 1 | 0 | 0 | 0 | 0 | $A·\bar{B}$ |
| | | | 0 | 1 | 0 | |
| | | | 1 | 0 | 1 | |
| | | | 1 | 1 | 0 | |
| (iv) | 1 | 1 | 0 | 0 | 0 | A+B |
| | | | 0 | 1 | 1 | |
| | | | 1 | 0 | 1 | |
| | | | 1 | 1 | 1 | |

F I G. 13

| S0 | B | S5 | A | OUTPUT | |
|---|---|---|---|---|---|
| 0 | 0 | 0 | 0 | 0 | S5 |
| | | 0 | 1 | 0 | |
| | | 1 | 0 | 1 | |
| | | 1 | 1 | 1 | |
| 0 | 1 | 0 | 0 | 0 | A |
| | | 0 | 1 | 1 | |
| | | 1 | 0 | 0 | |
| | | 1 | 1 | 1 | |
| 1 | 0 | 0 | 0 | 0 | A |
| | | 0 | 1 | 1 | |
| | | 1 | 0 | 0 | |
| | | 1 | 1 | 1 | |
| 1 | 1 | 0 | 0 | 0 | S5 |
| | | 0 | 1 | 0 | |
| | | 1 | 0 | 1 | |
| | | 1 | 1 | 1 | |

F I G. 14

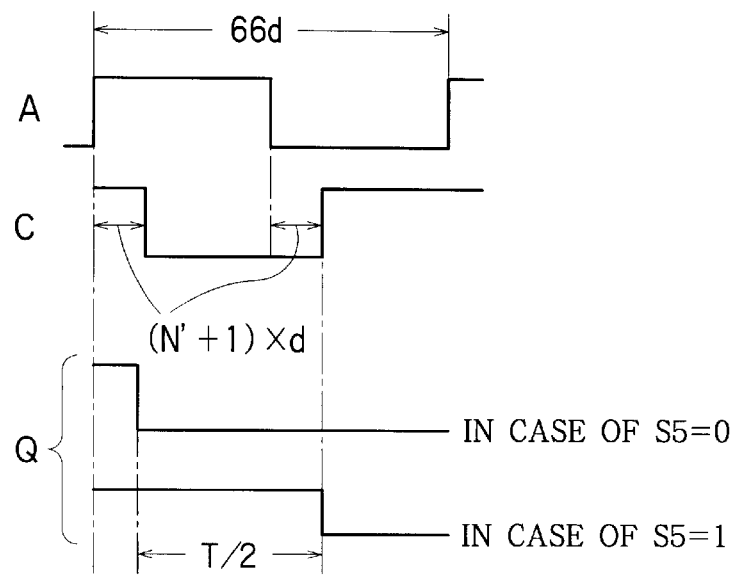
F I G. 15
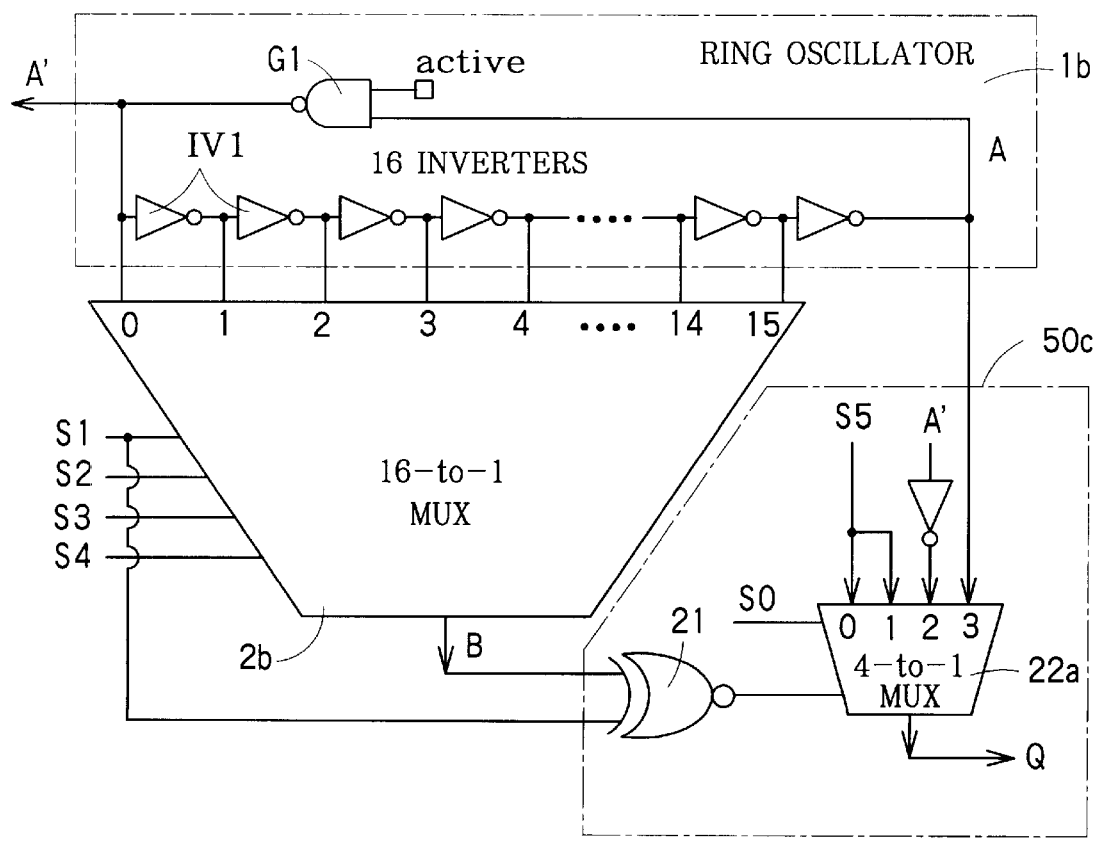
F I G. 16

| STAGE NUMBER | 0 | 1 | 2 | 3 | 4 | ... | 12 | 13 | 14 | 15 | A |
|---|---|---|---|---|---|---|---|---|---|---|---|
| RISE | 34 | 3 | 38 | 7 | 42 | ... | 58 | 27 | 62 | 31 | 0 |
| FALL | 1 | 36 | 5 | 40 | 9 | ... | 25 | 60 | 29 | 64 | 33 |

F I G. 17

| STAGE NUMBER | 0 | 1 | 2 | 3 | 4 | ... | 12 | 13 | 14 | 15 | A |
|---|---|---|---|---|---|---|---|---|---|---|---|
| RISE | 33 | 2 | 37 | 6 | 41 | ... | 57 | 26 | 61 | 30 | 65 |
| FALL | 0 | 35 | 4 | 39 | 8 | ... | 24 | 59 | 28 | 63 | 32 |

F I G. 18

| STAGE NUMBER | 0 | 1 | 2 | 3 | 4 | ... | 12 | 13 | 14 | 15 |
|---|---|---|---|---|---|---|---|---|---|---|
| RISE | 33 | 3 | 37 | 7 | 41 | ... | 57 | 27 | 61 | 31 |
| FALL | 1 | 35 | 5 | 39 | 9 | ... | 25 | 59 | 29 | 63 |

F I G. 19

| STAGE NUMBER | 0 | 1 | 2 | 3 | 4 | ... | 12 | 13 | 14 | 15 |
|---|---|---|---|---|---|---|---|---|---|---|
| RISE | 32 | 2 | 36 | 6 | 40 | ... | 56 | 26 | 60 | 30 |
| FALL | 0 | 34 | 4 | 38 | 8 | ... | 24 | 58 | 28 | 62 |

F I G. 20

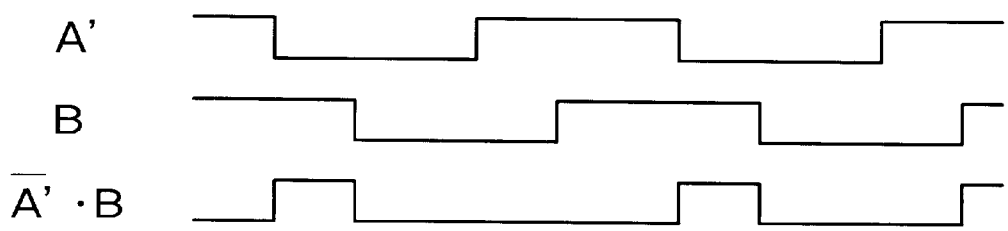
F I G. 22a
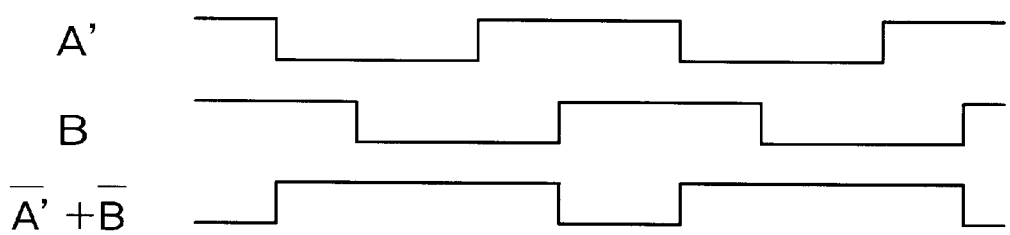
F I G. 22b
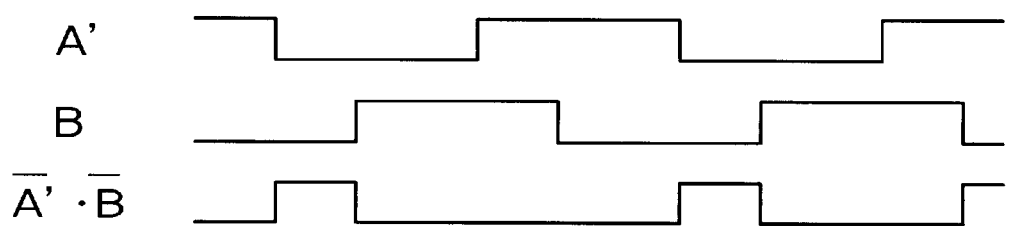
F I G. 22c
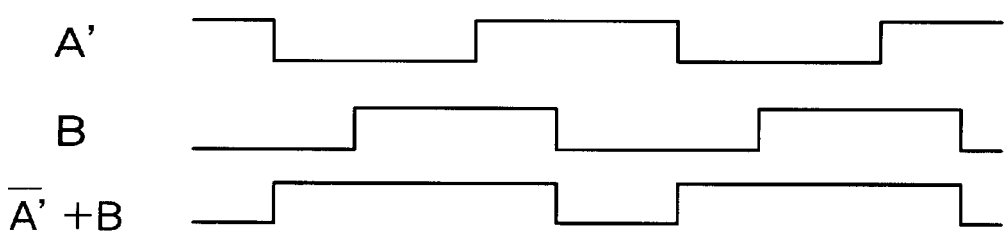
F I G. 22d

|   | S1 | S5 | A | B | OUTPUT |   |
|---|---|---|---|---|---|---|
| (i) | 0 | 0 | 0 | 0 | 0 | A·B |
|   |   |   | 0 | 1 | 0 |   |
|   |   |   | 1 | 0 | 0 |   |
|   |   |   | 1 | 1 | 1 |   |
| (ii) | 0 | 1 | 0 | 0 | 1 | A+$\bar{B}$ |
|   |   |   | 0 | 1 | 0 |   |
|   |   |   | 1 | 0 | 1 |   |
|   |   |   | 1 | 1 | 1 |   |
| (iii) | 1 | 0 | 0 | 0 | 0 | A·$\bar{B}$ |
|   |   |   | 0 | 1 | 0 |   |
|   |   |   | 1 | 0 | 1 |   |
|   |   |   | 1 | 1 | 1 |   |
| (iv) | 1 | 1 | 0 | 0 | 0 | A+B |
|   |   |   | 0 | 1 | 1 |   |
|   |   |   | 1 | 0 | 1 |   |
|   |   |   | 1 | 1 | 1 |   |

F I G. 23

|   | S1 | S5 | A' | B | OUTPUT |   |
|---|---|---|---|---|---|---|
| (i) | 0 | 0 | 0 | 0 | 0 | $\bar{A}'$·B |
|   |   |   | 0 | 1 | 1 |   |
|   |   |   | 1 | 0 | 0 |   |
|   |   |   | 1 | 1 | 0 |   |
| (ii) | 0 | 1 | 0 | 0 | 1 | $\bar{A}'$+$\bar{B}$ |
|   |   |   | 0 | 1 | 1 |   |
|   |   |   | 1 | 0 | 1 |   |
|   |   |   | 1 | 1 | 0 |   |
| (iii) | 1 | 0 | 0 | 0 | 1 | $\bar{A}'$·$\bar{B}$ |
|   |   |   | 0 | 1 | 0 |   |
|   |   |   | 1 | 0 | 0 |   |
|   |   |   | 1 | 1 | 0 |   |
| (iv) | 1 | 1 | 0 | 0 | 1 | $\bar{A}'$+B |
|   |   |   | 0 | 1 | 1 |   |
|   |   |   | 1 | 0 | 0 |   |
|   |   |   | 1 | 1 | 1 |   |

F I G. 24

| S1 | B | SO=0 | SO=1 |
|---|---|---|---|
| 0 | 0 | S5 | S5 |
| 0 | 1 | $\overline{A'}$ | A |
| 1 | 0 | $\overline{A'}$ | A |
| 1 | 1 | S5 | S5 |

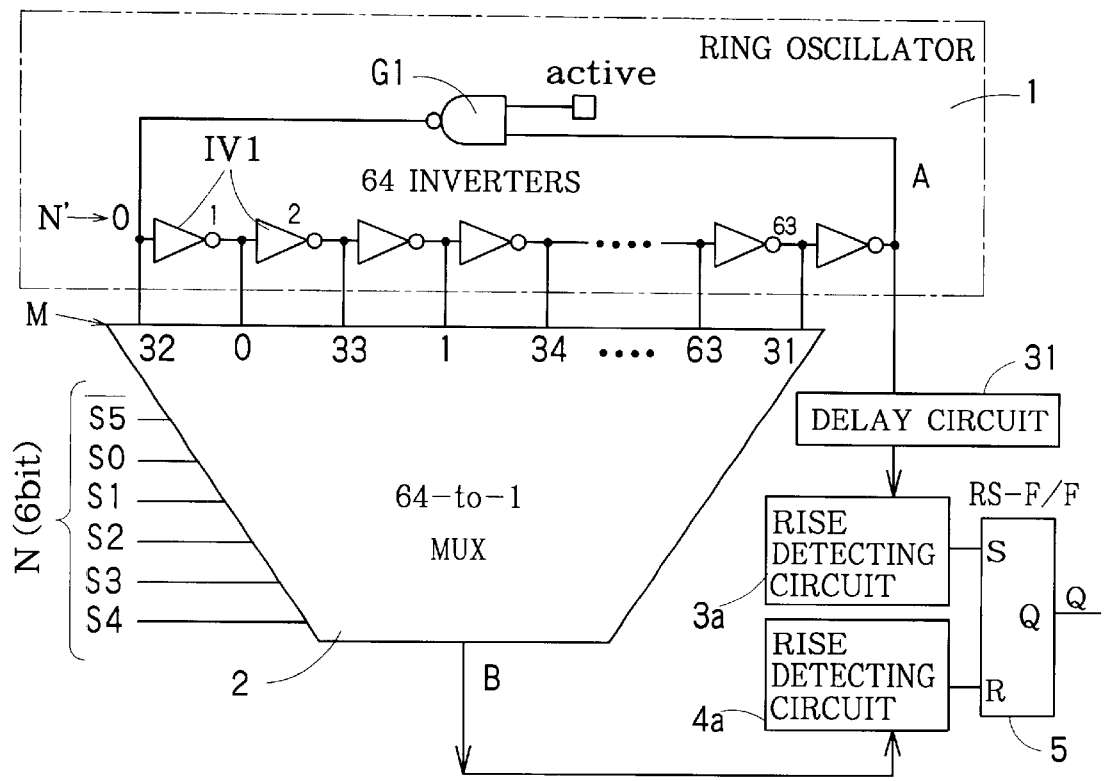
F I G. 27
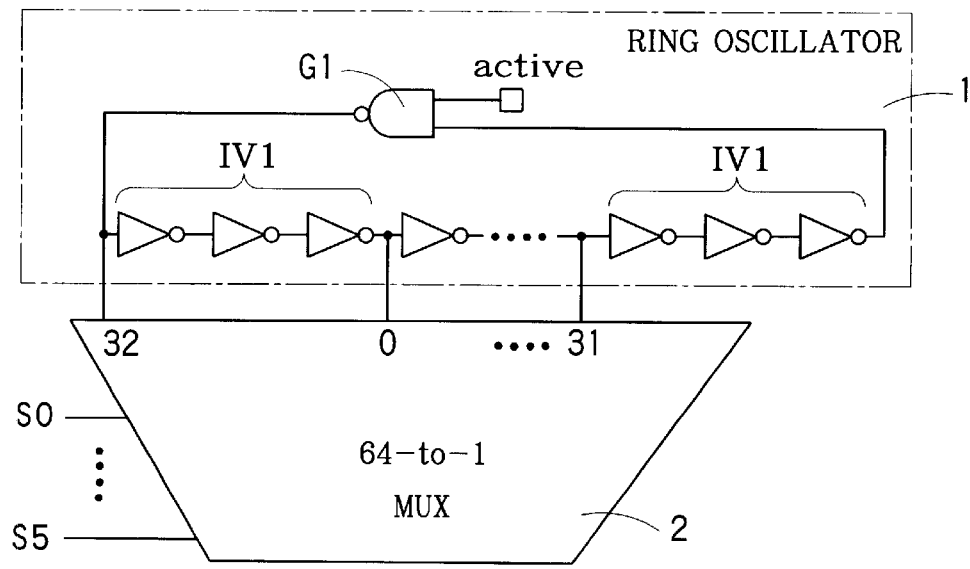
F I G. 28

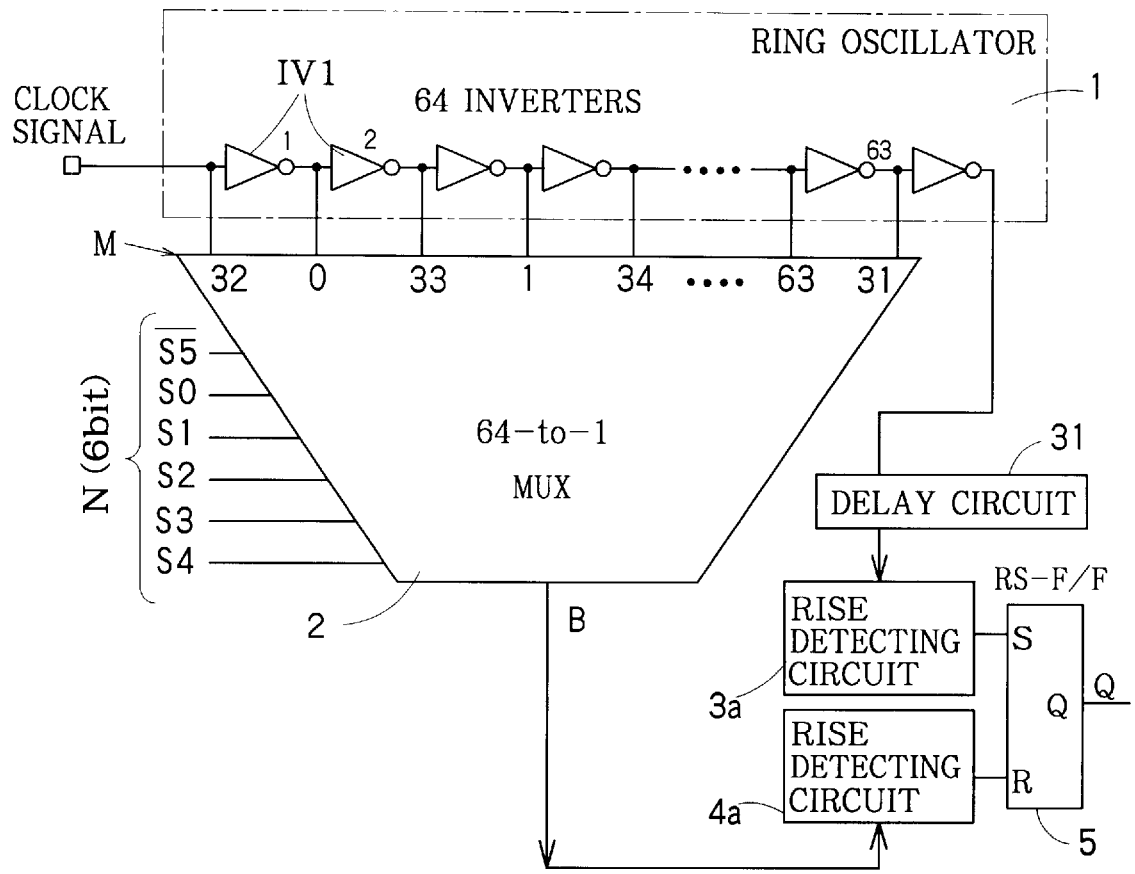
F I G. 29

PULSE WIDTH MODULATION WAVEFORM GENERATING CIRCUIT

BACKGROUND OF THE INVENTION

1. Field of the Invention

This invention relates to a circuit arrangement for generating a pulse width modulation (PWM) signal having a pulse width in accordance with logic of a digital signal.

2. Related Background Art

Since PWM (pulse width modulation) waveform generating circuits are widely used in various kinds of electronic circuits like a DC-DC converter (a switching power source), it is advantageous for an entire system to reduce the area occupied of the circuit and decrease its power consumption.

FIG. 1 is a block diagram of a conventional PWM waveform generating circuit, which shows an example configured to generate a PWM signal of a duty ratio in accordance with the logic of a 6-bit digital signal.

The PWM waveform generating circuit of FIG. 1 includes a ring oscillator 1 connecting 64 pieces of buffers BF in series, multiplexer (MUX) for selecting one of outputs of the buffers BF of different stages in the ring oscillator 1, change detecting circuit 3 for detecting a logic changing position of outputs from the ring oscillator 1, change detecting circuit 4 for detecting a logic changing position of output from the multiplexer 2, and RS flip-flop 5.

FIGS. 2a is a diagram explaining operational principle of the multiplexer 2, which shows an example configured to select one of $2^6=64$ kinds of input signals A0 through A63 according to the logic of 6-bit select signals D0 through D5. Among these select signals D0 through D5, if the least significant bit is D0 and the most significant bit is D5, then the numerical value M showing the select signals D0 through D5 is expressed by Equation (1).

$$M = D5 \times 2^5 + D4 \times 2^4 + D3 \times 2^3 + D2 \times 2^2 + D1 \times 2 + D0 \quad (1)$$

As shown by the bold line in FIG. 2a, when the input signal A3 is selected, for example, selecting signals (D5, D4, D3, D2, D1, D0) may be determined as (0, 0, 0, 0, 1, 1). That is, the decimal value of these selection signals is "3".

In this specification, it is assumed that the multiplexer performs selection in the same manner as shown in FIG. 2a independently from signal names of selections signals or input signals. For example, FIG. 2b shows an example in which different kinds of input signals (C0, C1, B5, B0, A4, . . . , Ro, F11) having T0 as the least significant bit and S5 as the most significant bit are inputted. For example, in case of (S5, S4, S3, S2, S1, S0, T0)=(0, 0, 0, 0, 1, 0), the third input signal B5 from the left end is selected as shown in FIG. 2b.

As shown in FIG. 3a in detail, the change detecting circuit 3 of FIG. 1 includes a delay circuit 6 for delaying a signal by a time approximately equal to the signal propagation delay time of the multiplexer 2, even numbered pieces of inverters 7 connected in series, and an EXOR gate 8, and output from the change detecting circuit 3 is inputted to a set terminal S of the RS flip-flop 5. Similarly, the change detecting circuit 4, shown in detail in FIG. 3b, includes an even numbered pieces of inverters 9 connected in series and an EXOR gate 10, and output from the change detecting circuit 4 is inputted to a reset terminal R of the RS flip-flop 5.

Output from the final-stage buffer BF in the ring oscillator 1 is inverted by a NAND gate G1, and thereafter fed back to the first-stage buffer BF. When the active terminal connected to the input terminal of the NAND gate G1 is set HIGH level, a stable status is lost, and the ring oscillator 1 oscillates. In contrast, when the active terminal is set LOW level, outputs from all of the buffers BF in respective stages become HIGH level, and oscillation stops. Although the active terminal is not indispensable, it is often provided in order to output a PWM signal only when required, for the purpose of reducing the power consumption.

There are no specific limitations for the number of bits of the digital signal inputted to the multiplexer 2 and the number of stages of buffers BF in the ring oscillator 1.

FIG. 4 is a timing diagram of respective portions in the PWM waveform generating circuit of FIG. 1. Shown in FIG. 4 are the waveform of output A from the ring oscillator 1, output waveform of the first-stage buffer BF, output waveform of the second-stage buffer BF, output waveform of the third-stage buffer BF, output waveform of the 33rd-stage buffer BF, output waveforms of the change detecting circuits 3 and 4, and output waveform of the RS flip-flop 5.

Behaviors of the circuit of FIG. 1 are explained below with reference to the tiling diagram of FIG. 4. Buffers BF in respective stages in the ring oscillator 1 each deliver the output signal of the first-stage buffer BF to the next buffer BF while delaying it by a predetermined time. The output signal from the final-stage buffer BF is inverted in phase by the NAND gate 11, and then inputted to the first-stage buffer BF.

The multiplexer 2 selects one of outputs from the buffers BF in the ring oscillator 1, based on the logic of the digital signal S0~S5.

The change detecting circuit 3 detects the rising edge and the falling edge of the output from the ring oscillator 1 and outputs a narrow-width pulse at time when each edge is detected. The change detecting circuit 4 detects the rising edge and the falling edge of the output from the multiplexer 2 and outputs a narrow-width pulse at time when each edge is detected.

For example, on the assumption that the output A from the ring oscillator 1 changes to HIGH level at time T1 of FIG. 4, the change detecting circuit 3 outputs a positive pulse lasting from time T1 to T2. Here, if bits of the digital signal is (1,0,0,0,0,0), then the output of the 33rd-stage buffer BF is selected by the multiplexer 2, and the change detecting circuit 4 outputs a positive pulse lasting from time T3 to T4. As a result, the RS flip-flop 5 is set at time T1, and reset at time T3. That is, the RS flip-flop 5 outputs a PWM signal having the pulse width lasting from time T1 to T3.

Similarly, the change detecting circuit 3 outputs a positive pulse lasting from time T5 to T6, and the change detecting circuit 4 outputs a positive pulse lasting from time T7 to T8. Therefore, the RS flip-flop 5 is set at time T5 and reset at time T7.

In case of arranging the PWM waveform generating circuit of FIG. 1 by using CMOS process, the circuit size of the ring oscillator 1 becomes large because each of the buffers BF in the ring oscillator 1 is made up of two inverters. For example, when buffers BF of 64 stages are connected in series, twice the stages of the buffers, that is, inverters of 128 stages must be connected. Such a large circuit size makes it difficult to miniaturize a system containing the circuit of FIG. 1, and increases its power consumption.

SUMMARY OF THE INVENTION

It is therefore an object of the present invention to provide a pulse width modulation waveform generating circuit that it is possible to reduce circuit size and power consumption.

To attain the object, a pulse width modulation waveform generating circuit for generating $2^n$ kinds of pulse width modulation signals having different pulse widths in accordance with a digital signal of n (n is an integer equal to or more than 2) bits, comprising:

oscillating signal output means for having m (m is an integer equal to or more than 2) pieces of first inverting means connected in series to each other, each of these first inverting means outputting an oscillating signal with a phase different from each other;

selecting means for selecting one of signals in accordance with each of output signals of said m pieces of first inverting means connected in series, based on at least partial bits of said digital signal of n bits, and pulse generating means for generating said pulse width modulation signal having a pulse width in accordance with the signal selected by said selecting means.

According to the present invention, since the oscillating signal output means is constituted by serially connecting a plurality of inverters and generate a pulse width modulation signal based on output of each inverter in the oscillating signal output means, it is possible to reduce circuit size and power consumption.

Additionally, when outputs from inverters of odd-numbered stages in the ring oscillator are regarded as signals delaying in phase by more than a half cycle from the output of the ring oscillator, these outputs from the inverters of odd-numbered stages need not be inverted, and this enables further reduction of the circuit size.

Furthermore, by providing a pulse generating means capable of generating one of different kinds of pulse width modulation signals as many as twice or four times the number of connected stages of inverters in the ring oscillator, it is possible to simplify structure of the ring oscillator and reduce circuit size and power consumption.

BRIEF DESCRIPTION OF THE DRAWINGS

FIG. 1 is a block diagram showing structure of a conventional PWM waveform generating circuit;

FIG. 2b is a diagram showing a modification of FIG. 2a;

FIGS. 3a and 3b are circuit diagrams showing interior structures of change detect circuits;

FIG. 4, is a timing chart of respective different portions in the PWM waveform generating circuit of FIG. 1;

FIG. 5 is a block diagram showing structure of a PWM waveform generating circuit according to the first embodiment of the present invention;

FIG. 6 is a block diagram showing structure of a PWM waveform generating circuit according to the second embodiment of the present invention;

FIG. 7 is a block diagram showing structure of a PWM waveform generating circuit according to the third embodiment of the present invention;

FIGS. 8a and 8b are circuit diagrams showing interior structures of rise detecting circuits;

FIG. 11 is a diagram showing relations between inputs to inverters of respective stages in a ring oscillator 1a and delay sequences of signals;

FIGS. 12a through 12d are timing charts showing examples configured to perform logical operation between outputs A and B and generate PWM signals different in pulse width;

FIG. 13 is a logic diagram corresponding to waveforms in FIGS. 12a through 12d;

FIG. 14 is a logic diagram rearranged from FIG. 13;

FIG. 15 is a timing waveform diagram of output A from the final stage of the ring oscillator, output C from an EXOR gate and output Q from a multiplexer;

FIG. 16 is a block diagram of a PWM waveform generating circuit according to the fifth embodiment of the present invention;

FIGS. 17 and 18 are diagrams showing a phase difference of the input signal of each stage of the inverters IV1 in the ring oscillator 1b;

FIGS. 19 and 20 are logic diagrams corresponding to FIGS. 17 and 18, respectively;

FIGS. 22a through 22d are timing charts showing examples configured to perform logical operation between output A' from a NAND gate and output B from the multiplexer and generate PWM signals different in pulse width;

FIG. 23 is a logic diagram corresponding to waveforms in FIGS. 21a through 21d;

FIG. 24 is a logic diagram corresponding to waveforms in FIGS. 21a through 21d;

FIG. 27 is a block diagram showing an example modified from the third embodiment shown in FIG. 7 by adding a delay circuit 31;

FIG. 28 is a block diagram showing an example connecting three or any larger odd number of inverters between every adjacent input terminals; and FIG. 29 is a diagram showing an example configured to introduce an external clock signal to the first stage of serially connected inverters.

DESCRIPTION OF THE PREFERRED EMBODIMENTS

Figure 2A:
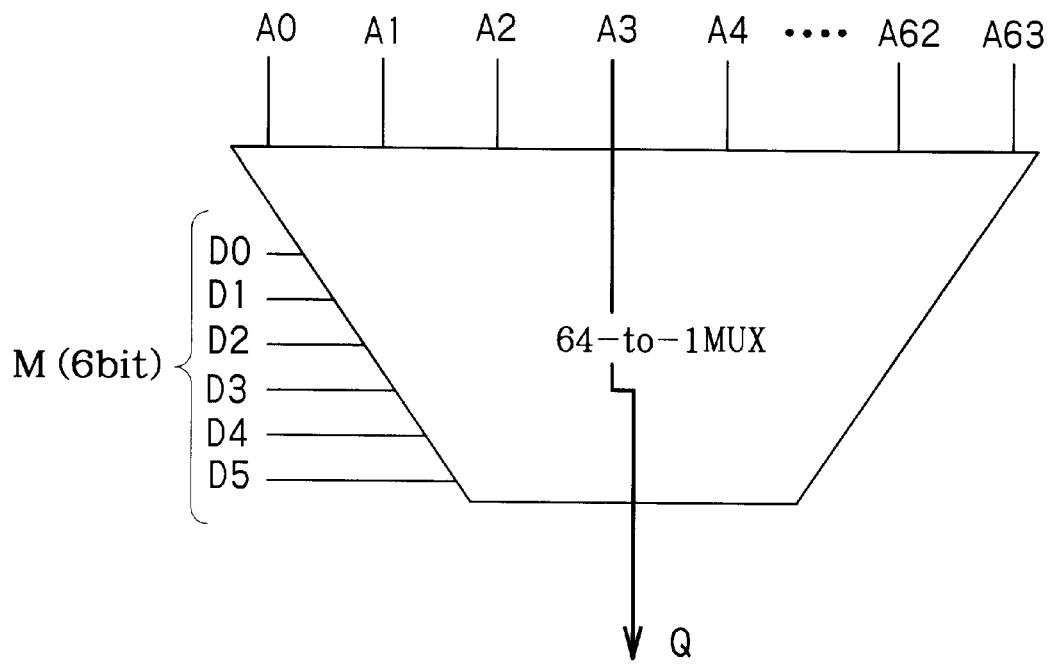
FIG. 2a is a diagram explaining the operation principle of a multiplexer.
Figure 2B:
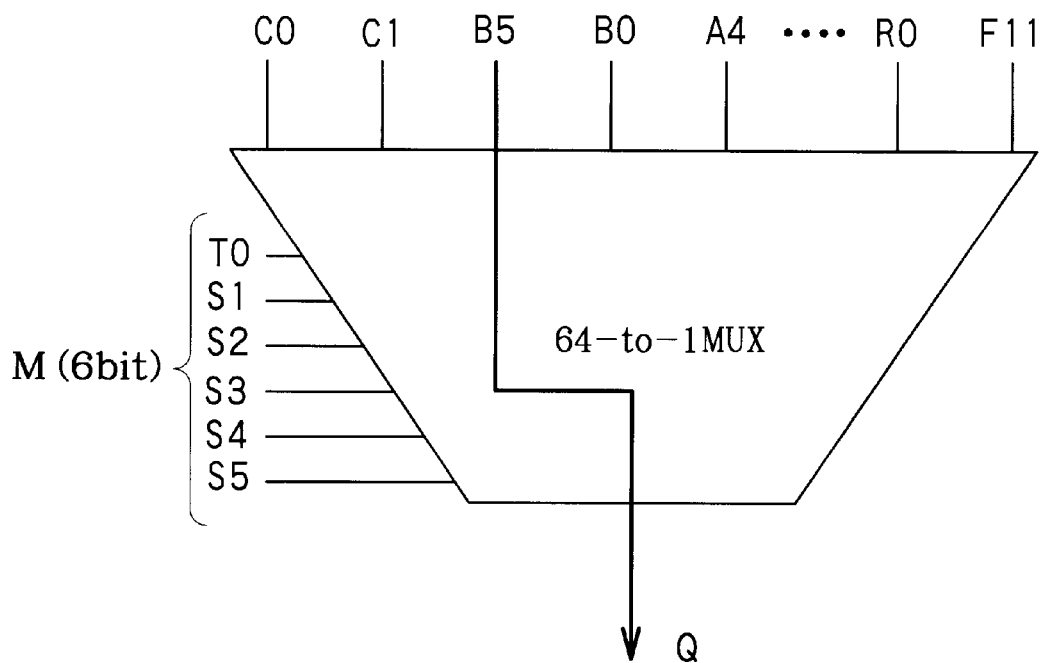

Pulse width modulation waveform generating circuits (hereinafter called PWM waveform generating circuits) according to the present invention are explained below in detail with reference to the drawings.

First Embodiment

FIG. 5 is a block diagram showing structure of a PWM waveform generating circuit according to the first embodiment of the present invention. In FIG. 5, components common to those of the conventional circuit shown in FIG. 1 are labeled with the same reference numerals.

The circuit of FIG. 5 includes a ring oscillator (oscillating signal output means) 1a made up of 64 pieces of inverter means IV1 connected in series, inverter means IV2 connected to output terminals of inverter means IV1 of odd numbered stages in the ring oscillator 1a, multiplexer (selecting means) 2, change detecting circuits (first and second edge detecting circuits) 3 and 4, and RS a flip-flop (set/reset circuit) 5. The change detecting circuits 3, 4 and the RS flip-flop 5 make up a pulse generating means 50.

The multiplexer 2 is supplied with outputs from the inverter means IV1 of even numbered stages in the ring oscillator 1a and outputs from the inverter means IV2. The multiplexer 2 selects one of them depending on the logic of the digital signal S0~S5.

Next explained are behaviors of the circuit of FIG. 5. The multiplexer 2 selects outputs from the inverter means IV1 of even numbered stages in the ring oscillator 1a or outputs from the inverter means IV2 in accordance with the logic of the digital signal S0~S5.

The change detecting circuit 3 detects the rising edge and the falling edge of an output A from the ring oscillator 1a and outputs an edge detecting pulse. The change detecting circuit 4 detect the rising edge and the falling edge of an output B from the multiplexer 2 and outputs an edge detecting pulse. The RS flip-flop 5 is set at time when the edge detecting pulse is outputted from the change detecting circuit 3, and reset at time when the edge detecting pulse is outputted from the change detecting circuit 4. Therefore, output from the RS flip-flop 5 outputs a PWM signal having a pulse width 1a sting from time when the output A from the ring oscillator 1a becomes HIGH level to time when the output from the multiplexer 2 becomes HIGH level.

Since the ring oscillator 1a of FIG. 5 includes 64 stages of inverter means IV1, if it is formed by CMOS process, for example, then its size is reduced to approximately a half the ring oscillator 1a of FIG. 1. However, since every adjacent inverter means IV1 are inverted in output logic from each other, the first embodiment inputs to the multiplexer 2 an inverting signal of the inverter means IV1 of odd numbered stages, of which the phase is different from that of the output A by more than a half cycle, with reference to the phase of the output A.

Therefore, this embodiment requires additional 32 pieces of inverter means IV2 connected to inverter means IV1 of odd numbered stages, and it results in including 64+32=96 pieces of inverters in total. Therefore, on the assumption that the area for forming an inverter is equal in all inverters, the ring oscillator 1a of FIG. 5 has a circuit area of $96/128=3/4$ as compared with the ring oscillator 1 of FIG. 1.

In case of the PWM waveform generating circuit of FIG. 5, since outputs of the inverter means IV1 of odd numbered stages in the ring oscillator 1a are inputted to the multiplexer 2 via the inverter means IV2, signals delay by time so much as they pass the inverter means IV2. The delay time is not immaterial when the oscillation frequency of the ring oscillator 1a is low. However, as the oscillation frequency increases, finally generated PWM signals come to produce an error in pulse width. Therefore, when a high-accuracy PWM signal is required, the signal propagation time may be decreased by adjusting the size of the inverter means IV2, or delay elements, etc. may be used to adjust the timing between outputs of inverter means IV1 of odd numbered stages in the ring oscillator 1a and outputs from inverter means IV1 of even numbered stages.

As explained above, the first embodiment can obtain the same phase as that of a ring oscillator 1a made up of a plurality of buffers because the ring oscillator 1a is made by serially connecting a plurality of inverter means IV1 and outputs from inverter means IV1 of odd numbered stages are inputted to the multiplexer 2 via the inverter means IV2. Therefore, similarly to the conventional circuit, the embodiment can generate a PWM signal by selecting a delay signal in accordance with the logic of the digital signal in the multiplexer 2.

Additionally, the ring oscillator 1a of FIG. 5 is made up of inverter means IV1 instead of buffers BF, it is possible to reduce its circuit size and power consumption when formed by the CMOS process.

Second Embodiment

The second embodiment has a feature in which the circuit size is smaller than the first embodiment.

FIG. 6 is a block diagram showing structure of a PWM waveform generating circuit according to the second embodiment of the present invention, and uses the same reference numerals for components common to those of FIG. 5.

The circuit of FIG. 6 is common to FIG. 5 in providing a plurality of serially connected inverter means IV1 in the ring oscillator 1a, but different from the circuit of FIG. 5 in also inputting outputs from inverter means IV1 of odd numbered stages directly to the multiplexer 2.

Output from the multiplexer 2 is inputted to an EXNOR (inversion/non-inversion setting circuit) 21. The EXNOR gate 21 inputs an inverted signal of the exclusive logical sum of an output from the multiplexer 2 and the least significant bit S0 of the digital signal to the change detecting circuit.

Next explained are behaviors of the circuit of FIG. 6. The multiplexer 2 selects and outputs one of outputs from the inverter means IV1 of respective stages in the ring oscillator 1a in accordance with the logic of the digital signal S0~S5.

For example, if the least significant bit S0 of the digital signal is "1", then the multiplexer 2 selects one of outputs from inverter means IV1 of even numbered stages. In this case, a signal with the same logic as that of the output from the multiplexer 2 is inputted to the change detecting circuit 4 via the EXNOR gate 21.

If the least significant bit S0 of the digital signal is "0", the multiplexer 2 selects one of outputs from inverter means IV1 of odd numbered stages. In this case, a signal inverted from the output of the multiplexer is inputted to the change detecting circuit 4 via the EXNOR gate 21. That is, when the least significant bit S0 of the digital signal is "0", since a signal inverted from the output of an inverter means IV1 of an odd numbered stages in the ring oscillator 1a is inputted to the change detect circuit 4, the result is the same as that of FIG. 5 where inverter means IV2 are connected to outputs of inverter means IV1 of odd numbered stages in the ring oscillator 1a.

As explained above, since the second embodiment is configured to directly input outputs from inverter means IV1 of odd numbered stages in the ring oscillator 1a to the multiplexer 2 and to select whether or not the output from the multiplexer 2 should be inverted in accordance with the logic of the least significant bit S0 of the digital signal, inverter means IV2 shown in FIG. 5 can be omitted, and the circuit can be further reduced in size and power consumption than FIG. 5.

Third Embodiment

The third embodiment has a feature in which the circuit size is further smaller than the second embodiment.

FIG. 7 is a block diagram showing structure of a PWM waveform generating circuit according to the third embodiment of the present invention, and uses the same reference numerals for components common to those of FIG. 5.

The circuit of FIG. 7 is different from the circuit of FIG. 5 in changing the order of bits S0~S5 of the digital signal inputted to the control input terminal of the multiplexer 2, having no EXNOR gate, and providing rise detecting circuits 3a and 4a instead of the change detecting circuits.

The control input terminal of the multiplexer 2 in FIG. 7 is supplied with a digital signal in the order of the inverted signal of the most significant bits S5, S0, S1, S2, S3 and S4 from its least significant side.

The third embodiment is characterized in utilizing the nature that a signal inputted to an inverter means IV1 is inverted in phase, and regarding the signal inverted by an inverter means IV1 as a signal delayed by more than a half cycle, instead of returning the signal inverted by the inverter means IV1 to the original logic.

For example, since the output A of the ring oscillator 1a is inputted to the first-stage inverter means IV1, output from the first-stage inverter means IV1 becomes a signal inverting and slightly delaying from the output A. This signal corresponds to the 32nd delay signal. Output from the second-stage inverter means IV1 corresponds to the 0-ordinal delay signal, output from the third-stage inverter means IV1 corresponds to the 33rd delay signal, and output from the fourth-stage inverter means IV1 corresponds to the first delay signal.

Numerical value M in FIG. 7 represents the phase sequence of inverters in the ring oscillator, in case of taking the output A from the final-stage inverter in the ring oscillator as the reference. Numerical value N' represents ordinal numbers of inverters in the ring oscillator.

Outputs from inverters of even numbered stages (N' is an even number) are delayed from the final stage output A by more than a half cycle. The phase difference M in this case becomes a value adding the time of a half cycle to the signal propagation time determined by the ordinal number N' of the inverter, namely, M=N'/2+32.

On the other hand, outputs from inverters of odd numbered stages (N' is an odd number) have a phase difference within a half cycle from the final stage output A. The phase difference M in this case can be expressed by M=(N'−1)/2.

Therefore, for both the even numbered stages and odd numbered stages, by taking the inverted signal of the most significant bit S5 of a select control signal N (S5~S0) as the least significant bit and shifting the other bits by one bit toward more significant sides, the control input N and the order M of phase differences from the output from the multiplexer can be brought into coincidence.

As shown in FIG. 8a in detail, the rise detecting circuit 3a in FIG. 7 includes a delay circuit 6 for delaying the output from the ring oscillator 1a by a time approximately equal to the signal propagation delay time of the multiplexer 2, an odd number of serially connected inverters 7, and an AND gate 31. The rise detecting circuit 4a in FIG. 8b includes an odd number of serially connected inverters 9 and an AND gate 32.

The rise detecting circuit 3a detects the rising edge of the output A from the ring oscillator 1a, and the rise detecting circuit 4a detects the rising edge of the output B from the multiplexer 2.

Figure 9:
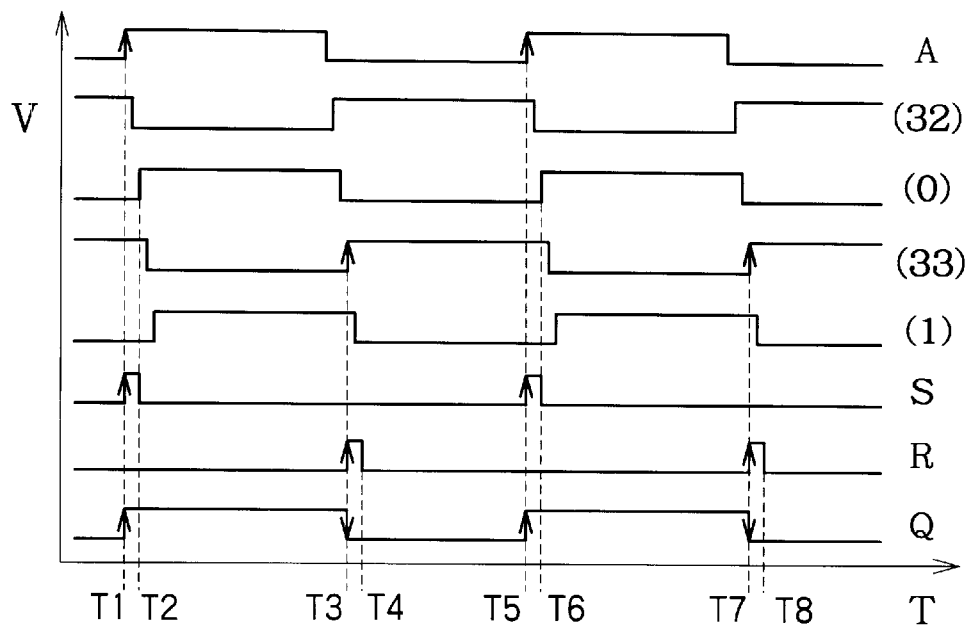
FIG. 9 is a timing chart of different portions in the circuit of FIG. 7.

FIG. 9 is a timing chart of different portions in the circuit of FIG. 7. The timing chart of FIG. 9 shows an example generating PWM signal by using the 33rd delay signal.

Output from the rise detecting circuit 3a becomes HIGH level during period from time T1 to T2 and the period from time T5 to T6 in FIG. 9. Output from the rise detecting circuit 4a becomes HIGH level during period from time T3 to T4 and the period from time T7 and T8 in FIG. 9.

The RS flip-flop 5 is set at time T1, reset at time T3, set at time T5 and reset at time T7. Therefore, the PWM waveform generating circuit of FIG. 9 outputs a signal which becomes HIGH level during period from time T1 to T3 and the period from time T5 to T7.

As explained above, since the third embodiment is configured to regard outputs from inverter means IV1 of odd numbered stages among outputs from inverter means IV1 in the ring oscillator 1a as signals delayed by more than a half cycle to select one of these signals in the multiplexer 2, the third embodiment does not need the process for inverting outputs from inverter means IV1 of odd numbered stages, which is required in the first and second embodiments, and the circuit of the third embodiment is therefore further reduced in size and power consumption.

Fourth Embodiment

The fourth embodiment has a feature in which 64 kinds of PWM signals are generated by using 32 stages of inverters.

Figure 10:
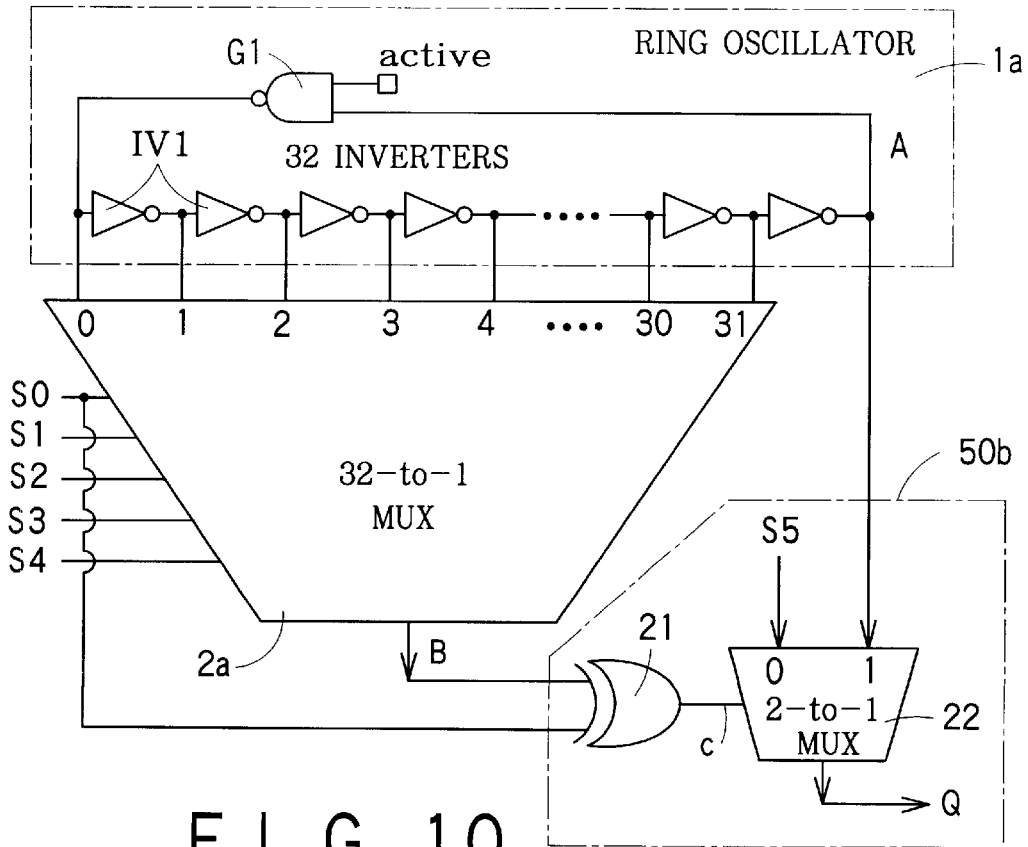
FIG. 10 is a block diagram of a PWM waveform generating circuit according to the fourth embodiment of the present invention.
Figure 21A:
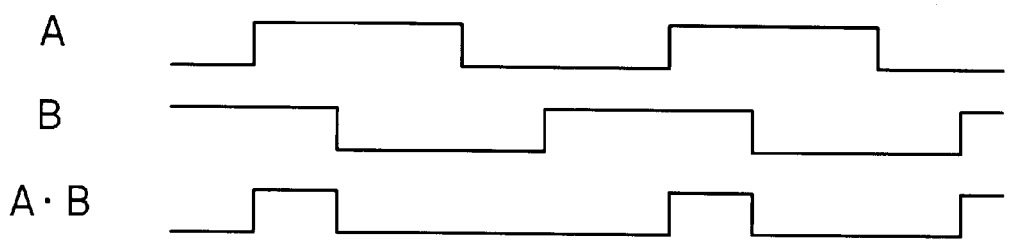
FIGS. 21a through 21d are timing charts showing examples configured to perform logical operation between output A from the ring oscillator and output B from the multiplexer and generate PWM signals different in pulse width.
Figure 21B:
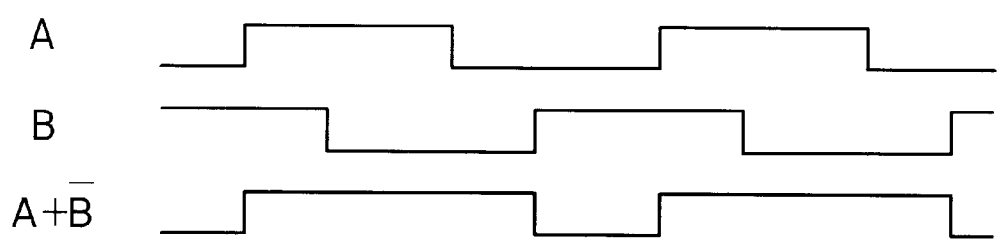
Figure 21C:
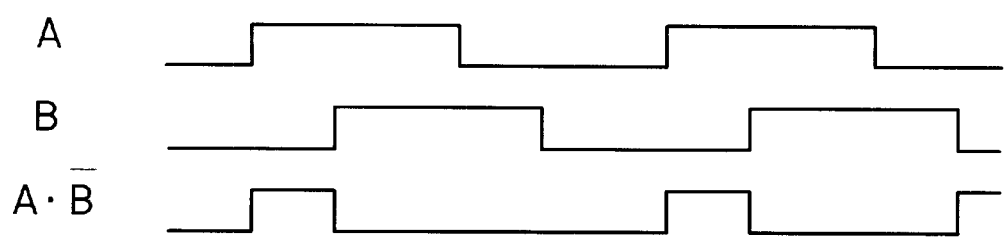
Figure 21D:
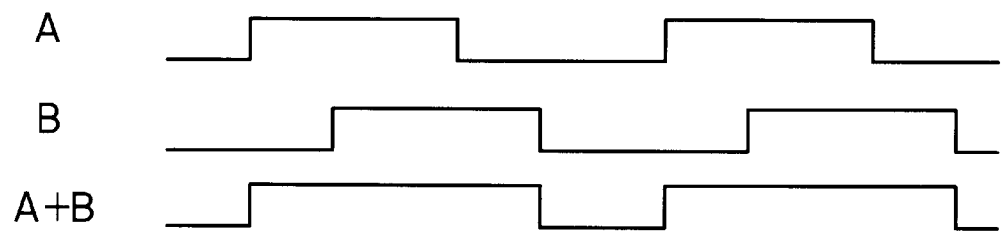

FIG. 10 is a block diagram of a PWM waveform generating circuit according to the fourth embodiment of the present invention. The PWM waveform generating circuit of FIG. 10 includes a ring oscillator 1a, a multiplexer 2a, an EXOR gate 21, and a two-input one-output multiplexer 22. The EXOR gate 21 and the multiplexer 22 form a pulse generating means 50b.

The ring oscillator 1a includes 32 inverter means IV1 connected in series, and a NAND gate (logic inverting means) G1 connected between the output terminal of the final-stage inverter means IV1 and the input terminal of the first-stage inverter means IV2.

One of the input terminals of the NAND gate G1 is connected to the output terminal of the final-stage inverter means IV1 in the ring oscillator 1a, and the other input terminal is connected to an active terminal.

Next explained is the basic principle of the fourth embodiment. A pulse signal inputted to the fist-stage inverter means IV1 of the ring oscillator 1a delays by a predetermined time every time when passing subsequent inverter means IV1 one by one, and the output A of the final-stage inverter means IV1 becomes a signal delayed in phase by about a half cycle relative to the input signal to the first-stage inverter means IV1.

More specifically, when taking the output A from the ring oscillator 1a as the reference, each of outputs from inverter means IV1 of odd numbered stages become a signal delayed from the output A by a predetermined time. On the other hand, each of output from inverter means IV1 of even numbered stages becomes a signal delayed from the inverting signal of the output A by a predetermined time. That is, from inverter means IV1 of even numbered stages, signals different in phase by more than a half cycle from the output terminals are outputted. Additionally, falling edges of outputs from inverter means IV1 of respective stages become signals shifted in phase by a half cycle from rising edge of outputs of inverter means IV1 of respective stages.

Therefore, by talking account for outputs from 32 inverter means IV1 in the ring oscillator 1a and their inverting signals, it is possible to obtain 64 kinds of signals different in phase in total.

That is, although the foregoing first through third embodiments have utilized only the rising edge of the signal, the fourth embodiment also use falling edge of the signal. Therefore, it is possible to reduce the number of stages of the inverters in the ring oscillator by half.

Hereinafter, the rising edge and the falling edge will be called "edge" as a general name. The following pulse signals are corresponded to 64 kinds of edges.

The fourth embodiment is configured to select one of 64 kinds of signals different in phase on the basis of the logic of the digital signal S0~S5 and to generate 64 kinds of PWM signals different in pulse width, based on the selected edge and the output A of the ring oscillator 1*a*.

Which one of input/output signals of the inverter means IV1 of respective stages in the ring oscillator 1*a* should be selected depends on the logic of the five-bit digital signal S0~S4 inputted to the multiplexer 2*a*, for example, if the digital signal is "00000", the input signal of the first-stage inverter means IV1 is selected. When the digital signal is "11111", the input signal of the final-stage inverter means IV1 is selected.

FIG. 11 is a diagram showing a relationship between an input of each inverter means IV1, and an order of phase of rising edge and falling edge of the signals. Stage number "0" of FIG. 11 corresponds to a first stage of the inverter means IV, and "31" to a final stage of the inverter means IV1. The order of phase takes a rising edge of the output signal A in the ring oscillator 1*a* as a reference. When the output signal A rises, the signal is inverted by the gate G1; as a result, the signal falls at "0" stage. Accordingly, the signal is inverted by the initial inverter means IV1; as a result, the signal falls by "1" stage.

In such a way, the signal is transferred while repeating inversion. When the signal rises at "31" stages, the output signal A of the final stage of the inverter means IV1 falls; as a result, the signal rises at "0" stage. This signal is transferred one by one, and then the falling edge of the stage number "31" becomes 63rd phase. Next, the output signal A rises again. Hereinafter, the above-mentioned process is repeated.

The fourth embodiment generates a PWM waveform as follows. First of all, one of 32 kinds of output signals in the ring oscillators 1*a* is selected. Hereinafter, this signal will be called a selecting target signal. Next, either of a rising edge or a falling edge of the selecting target signal is selected. Hereinafter, the selected edge is called a reference edge. When assuming a PWM waveform that rises at the same time with a reference edge and falls at the same time with the selecting target edge, a pulse width of this signal is in proportion to a phase delay of the selected edge. Accordingly, if maintaining the order of the phase and a large or small relation of the integer N(N=0–63) which is decided by the digital signals S0–S5, it is possible to generate the PWM waveform having the pulse width in accordance with N.

Here, N is expressed by using 6 bits signal S0–S5 as follows.

$$N=S0+2\times S1+2^2\times S2+2^3\times S3+2^4\times S4+2^5\times S5$$

In order to set N such as shown in the above equation, the following process is needed. That is, an integer N' decided by five bits at lower side is corresponded to stage numbers.

$$N'=S0+2\times S1+2^2\times S2+2^3\times S3+2^4\times S4$$

Furthermore, either of the rising edge or the falling edge is selected in accordance with the most significant bit S5. That is, if S5 is 0, the edges having the phase delay within a half cycle is selected. If S5 is 1, the stage number having the phase delay equal to or more than a half cycle is selected.

For example, when N=(100101), that is, N=36, a figure decided by 5 bits at low side is (00101). That is, the stage number is four. Furthermore, because the most significant bit S5 is "1", the rising edge having a phase difference equal to or more than a half cycle, which is phase ordinal number 36 in FIG. 11, is selected. In such a way, it is possible to generate PWM signals having a different pulse width in accordance with the integer N decided by S0–S5.

FIGS. 12*a*–12*d* is a timing chart showing an example generating the PWM waveform based on the above function. A waveform "a" is a timing chart when (S0,S5)=(0,0). A waveform "b" is a timing chat when (S0,S5)=(0,1). A waveform "c" is a timing chat when (S0,S5)=(1,0). A waveform "d" is a timing chat when (S0,S5)=(1,1).

A "B" is a selecting target signal selected by the multiplexer 2*a*. As shown in FIGS. 12*a* and 12*b*, when S0=0, the phase difference is equal to or more than a half cycle, because the stage number is even. When S5=0, an edge having a pulse width within a half cycle is selected.

Waveforms of FIGS. 12*a* through 12*d* can be expressed by a logical table shown in FIG. 13. In FIG. 13, (i) corresponds to FIG. 12*a*, (ii) to FIG. 12*b*, (iii) to FIG. 12*c* and (iv) to FIG. 12*d*, respectively.

When bits S0 and S5 of the digital signal are (0, 0), PWM signal are generated, based on signals whose ordinal numbers of phase difference relative to the output A are "0, 2, 4, . . . , 30". In this case, the result OUT of logical operation between the output A from the ring oscillator 1*a* and the output B from the multiplexer 2 is expressed by logical equation (2) shown below:

$$\text{OUT}=A\cdot B \tag{2}$$

When bits S0 and S5 of the digital signal are (0, 1), PWM signals are generated, based on signals whose ordinal numbers of phase difference from the output A are "32, 34, 36, . . . 62". In this case, the result OUT of logical operation between the output A of the ring oscillator 1*a* and the output B of the multiplexer 2 is expressed by logical equation (3) shown below:

$$\text{OUT}=A+/B \tag{3}$$

When bits S0 and S5 of the digital signal are (1, 0), PWM signals are generated, based on signals whose ordinal numbers of phase difference from the output A are "1, 3, 5, . . . , 31". In this case, the result of OUT of logical operation between the output A of the ring oscillator 1*a* and the output B of the multiplexer 2 is expressed by logical equation (4) shown below:

$$\text{OUT}=A\cdot/B \tag{4}$$

When bits S0 and S5 of the digital signal are (1, 1), PWM signals are generated, based on signals whose ordinal number of phase difference relative to the output A are "33, 35, 37, . . . , 63". In this case, the result OUT of logical operation between the output A of the ring oscillator 1*a* and the output B of the multiplexer 2 is expressed by logical equation (t) shown below:

$$\text{OUT}=A+B \tag{5}$$

The logical diagram of FIG. 13 can be rearranged as FIG. 14. It is noted from FIG. 14 that, when the least significant bit S0 of the digital signal and the output signal B of the multiplexer 2 are (0, 0), the PWM signal OUT is equal to the logic of the most significant bit S5 of the digital signal.

When the signal S0 and the output B are (0, 1), the PWM signal OUT is equal to the logic of the output signal A from the ring oscillator 1a. Similarly, also when the signal S0 and the output B are (1, 0), the PWM signal OUT equals the logic of the output signal A from the ring oscillator 1a. Additionally, when signals S0 and B are (1, 1), the PWM signal OUT is equal to the logic of the most significant bit 55 of the digital signal.

A circuit based on the logical diagram of FIG. 14 turns out as shown in FIG. 10. The EXOR gate 21 operates the exclusive logical sum of the output signal B from the multiplexer 2a and the least significant bit S0 of the digital signal. The multiplexer 22 selects one of the signal S5 and the signal A based on the logic of the EXOR gate 21.

Next explained are behaviors of the circuit of FIG. 10. The outputs from inverter means IV1 of even numbered stages in the ring oscillator delay in phase from the final-stage output A of the ring oscillator 1a by more than a half cycle. On the other hand, delay in phase of outputs from inverter means IV1 of odd numbered stages is within a half cycle. However, since one of the input terminals of the EXOR gate 21 of FIG. 10 is supplied with the least significant bit S0 of the digital signal, the EXOR gate 21 inverts the output of multiplexer 2a only when the multiplexer 2a selects an output of an inverter means IV1 of an odd numbered stage. As a result, output C from the EXOR gate 21 always delays in phase by more than a half cycle from the final-stage output A of the ring oscillator 1a.

FIG. 15 is a timing waveform diagram of the final-stage output A of the ring oscillator 1a, output C of the EXOR gate 21, and output Q of the multiplexer 22. If the delay time of the NAND gate G1 is d, then the period T is T=66 d for both the final-stage output A of the ring oscillator 1a and the output B of the multiplexer 2a.

When the stage number of inverter means IV1 within the ring oscillator 1a is N', the signal propagation delay time Tall totaling the NAND gate G1 and the ring oscillator 1a is (N'+1)×d. A phase difference of a value adding a half cycle to the delay time Tall exists between the output A and the output C.

As shown in FIG. 10, since output C of the EXOR gate 21 is inputted to the control input terminal of the multiplexer 22, output Q of the multiplexer 22 changes as shown in FIG. 15 depending on the logic of the most significant bit S5 of the digital signal.

Therefore, the time where the output Q keeps "1", i.e., the pulse width of the PWM signal, is expressed by Equation (6).

$$(N'+1) \times d + S5 \times T2/2 = (N+1+S5) \cdot 66 \qquad (6)$$

From Equation (6), when N=0, 1, 2, ..., 62 and 63, the duty factor of the output Q (PWM signal) becomes 1/66, 2/66, ..., 64/66 and 65/66, respectively.

As explained above, since the fourth embodiment constitutes the ring oscillator 1a by serially connecting 32 stages of inverter means IV1 and generates 64 kinds of signals different in phase by using outputs of inverters of respective stages and their inverting outputs, it is possible to generate 64 kinds of PWM signals without connecting 64 stages of inverters in series. Therefore, the circuit can be reduced in size and power consumption as compared with conventional PWM waveform generating circuits.

Fifth Embodiment

The fifth embodiment has a feature in which 64 kinds of PWM signals are generated by using a ring oscillator 1b made up of 16 stages of serially connected inverters.

FIG. 16 is a block diagram of a PWM waveform generating circuit according to the fifth embodiment of the present invention. The PWM waveform generating circuit of FIG. 16 includes the ring oscillator 1b, a multiplexer 2b having 16 inputs and one output, an EXOR gate 21, and a multiplexer 22a having four inputs and one output. The EXOR gate 21 and the multiplexer 22a form a pulse generating means 50a.

The ring oscillator 1b includes 16 inverter means IV1 connected in series, and a NAND gate G1 connected between the output terminal of the final-stage inverter means IV1 and the input terminal of the first-stage inverter means IV1. The signal propagation delay time of the NAND gate G1 is set to about a half of the signal propagation delay time of inverter means IV1 in the ring oscillator 1b.

One of input terminals of the NAND gate G1 is connected to the output terminal of the final-stage inverter means IV1 of the ring oscillator 1b, and the other input terminal thereof is connected to an active terminal.

The PWM waveform generating circuit of FIG. 16 is characterized in outputting 64 kinds of control signals different in pulse width by using 16 stages of inverter means IV1.

FIGS. 17 and 18 are diagrams showing a phase difference of the input signal of each stage of the inverters IV1 in the ring oscillator 1b. In FIGS. 17–18, the signal propagation delay time of inverter means IV1 in the ring oscillator 1b is expressed by "2" and the signal propagation delay time of the NAND gate G1 by "1".

FIG. 17 shows magnitude of phase difference of inputs to the inverter means IV1, when taking a rising edge of the output A from the final-stage inverter means IV1 in the ring oscillator 1b as the reference. FIG. 18 shows magnitude of phase difference of inputs to inverter means IV1, when taking a falling edge of the output A' of the NAND gate G1 as the reference. FIGS. 19 and 20 are related to FIGS. 17 and 18, respectively, and show the order of delays instead of magnitude of phase difference.

If the rising time of the output A from the ring oscillator 1b is "0", then the falling time of the output from the NAND gate G1 is "1", as shown in FIG. 17. Next, the rising time of the output from the first-stage inverter is "3". Subsequently, in the same manner, the signal delays by "2" and is inverted in phase every time when it passes each of the inverter means IV1.

On the other hand, if the falling time of the output from the NAND gate G1 is "0", the rising time of the output from the first-stage inverter means IV1 becomes "2" as shown in FIG. 18. Subsequently in the same manner, the signal delays by "2" and is inverted in phase every time when it passes each of the inverter means IV1.

As noted from FIGS. 17 and 18, when taking account for the case using the output from the final-stage inverter means IV1 of the ring oscillator 1b as the reference and the case using the output from the NAND gate G1 as the reference, 64 kinds of delay signals can be obtained from outputs of respective inverter means IV1 in the ring oscillator 1b.

The fifth embodiment is characterized in generating 32 kinds of PWM signals, based on the output A from the final-stage inverter means IV in the ring oscillator 1b and the output B from one of 16 stages of inverters in the ring oscillator 1b, and also generating 32 kinds of PWM signals, based on the output A' from the NAND gate and the output B from one of 16 stages of inverters in the ring oscillator 1b.

FIGS. 19 and 20 are diagrams showing the phase order instead of values of the phase difference, which are based on FIGS. 17 and 18. When comparing the numerals of the same stage number in FIG. 19 and 20, the numerals in FIG. 19 is one bigger than those in FIG. 20. Furthermore, the larger the stage number is, the larger the numerals is.

Hereinafter, the rising edge of the output A of the last stage of the inverter means IV1 in the ring oscillator 1b and the falling edge of the output A' of the NAND gate G1 is called as a reference edge. Furthermore, the signal selected among 16 kinds of output of each inverter means IV1 is called a selecting target signal, and the signal selecting either the rising edge or the falling edge of the selecting target signal is called a selecting target edge.

On the basis of 32 kinds of selecting target edges and 2 kinds of reference edges in FIGS. 19 and 20, the PWM waveforms having 64 kinds of pulse widths is generated as follows. When the least significant bit S0 is 0, the falling edge of the output A' of the NAND gate is taken as a reference. On the other hand, when the S0 is 1, the rising edge of the output A of the final stage of the inverters is taken as a reference. The intermediate 4 bits and an integer decided by S1 through S4 bits are corresponded with the stage numbers. For example, when (S4,S3,S2,S1)=(0,0,1,1)=3, the stage number 3 is selected.

Of the rising edge and the falling edge, if the most significant bit S5 is 0, the phase order equal to or less than 31 is selected. The S5 is 1, the phase order equal to or more than 32 is selected. For example, when S0=0 and S5=1 in the stage number 3, the phase order 39 in FIG. 19, which is the falling edge, is selected. The PWM waveform, which rises at the same time the reference edge rises and falls at the same time the selecting target edge falls, is generated. The pulse width of the generated PWM waveform depends on the integer N decided by S0 through S5. The larger N is, the larger the pulse width becomes.

FIGS. 21 and 22 are timing charts showing an example generating the PWM signal from a standard signal and the selecting target signal. FIG. 21 shows a case of S0=1. Each of FIGS. 21a–21d shows a case of (S1,S5)=(0,0)(0,1)(1,0)(1,1), respectively.

FIG. 21 shows a case of S0=1. The rising edge of A is selected as a reference edge. FIGS. 21a–21b show a case of S1=0. The stage number is odd, and The phase difference between the selecting target signal "B" and the standard signal A is equal to or more than a half cycle.

If selecting the falling edge of "B" when S5=0, a pulse width of the generated PWM signal is equal to or less than a half cycle. If selecting the rising edge of "B" when S5=1, width of the generated PWM signal is equal to or more than a half cycle. A case of "c" or "d" is the same as a case of "a" or "b", except that the phase difference is equal to or less than a half cycle.

On the other hand, FIG. 22 is a signal waveform diagram in case of S0=0. In this case, the falling edge of A' is selected as a standard signal. Each of FIGS. 22a–22d corresponds to (S1,S5)=(0,0)(0,1)(1,0)(1,1). FIG. 22 is the same as FIG. 21, except for using the falling edge of A' as the reference edge.

Waveforms of FIGS. 21A through 21d can be expressed by a logical table shown in FIG. 23. In FIG. 23, (i) corresponds to FIG. 21A, (ii) to FIG. 21B, (iii) to FIG. 21c and (iv) to FIG. 21d, respectively. When the least significant bit S0 of the digital signal is "1" and bits S1 and S5 of the digital signal are (0, 0), PWM signal are generated, based on edges whose ordinal numbers of phase difference "1, 5, 9, ..., 29". In this case, relations among outputs A, B and PWM signal OUT are expressed by logical equation (7) shown below.

$$\text{OUT} = A \cdot B \tag{7}$$

When the least significant bit S0 of the digital signal is "1" and bits S1 and S5 of the digital signal are (0, 1), PWM signal are generated, based on signals whose ordinal numbers of phase difference are "33, 37, 41, ..., 61". In this case, relations among outputs A, B and PWM signal OUT are expressed by logical equation (8) shown below.

$$\text{OUT} = A + /B \tag{8}$$

When the least significant bit S0 of the digital signal is "1" and bits S1 and S5 of the digital signal are (1, 0), PWM signal are generated, based on signals whose ordinal numbers of phase difference are "3, 7, 11, ..., 31". In this case, relations among outputs A, B and PWM signal OUT are expressed by logical equation (9) shown below.

$$\text{OUT} = /A \cdot /B \tag{9}$$

When the least significant bit S0 of the digital signal is "1" and bits S1 and S5 of the digital signal are (1, 1), PWM signals are generated, based on signals whose ordinal numbers of phase difference are "35, 39, 43, ..., 63". In this case, relations among outputs A, B and PWM signal OUT are expressed by logical equation (10) shown below.

$$\text{OUT} = A + B \tag{10}$$

Similarly, waveforms of FIGS. 22a through 22d can be expressed by a logical table shown in FIG. 24. In FIG. 24, (i) corresponds to FIG. 22a, (ii) to FIG. 22b, (iii) to FIG. 22c and (iv) to FIG. 22d, respectively. When the least significant bit S0 of the digital signal is "0" and bits Si and S5 of the digital signal are (0, 0), PWM signals are generated, based on signals whose ordinal numbers of phase difference are "0, 4, 8, ..., 28". In this case, relations among outputs A', B and PWM signal OUT are expressed by logical equation (11) shown below.

$$\text{OUT} = /A' \cdot /B \tag{11}$$

When the least significant bit S0 of the digital signal is "0" and bits S1 and S5 of the digital signal are (0, 1), PWM signals are generated, based on signals whose ordinal numbers of delay are "32, 38, 40, ..., 60". In this case, relations among outputs A', B and PWM signal OUT are expressed by logical equation (12) shown below.

$$\text{OUT} = /A' \cdot /B \tag{12}$$

When the least significant bit S0 of the digital signal is "0" and bits S1 and S5 of the digital signal are (1, 0), PWM signals are generated, based on signals whose ordinal numbers of phase difference are "2, 6, 10, ..., 30". In this case, relations among outputs A', B and PWM signal OUT are expressed by logical equation (13) shown below.

$$\text{OUT} = /A' \cdot /B \tag{13}$$

When the least significant bit So of the digital signal is "0" and bits S1 and S5 of the digital signal are (1, 1), PWM signals are generated, based on signals whose ordinal numbers of delay are "34, 38, 42, ..., 62". In this case, relations among outputs A', B and PWM signal OUT are expressed by logical equation (14) shown below.

$$OUT = /A' \cdot /B \quad (9)$$

Figures 25, 26:
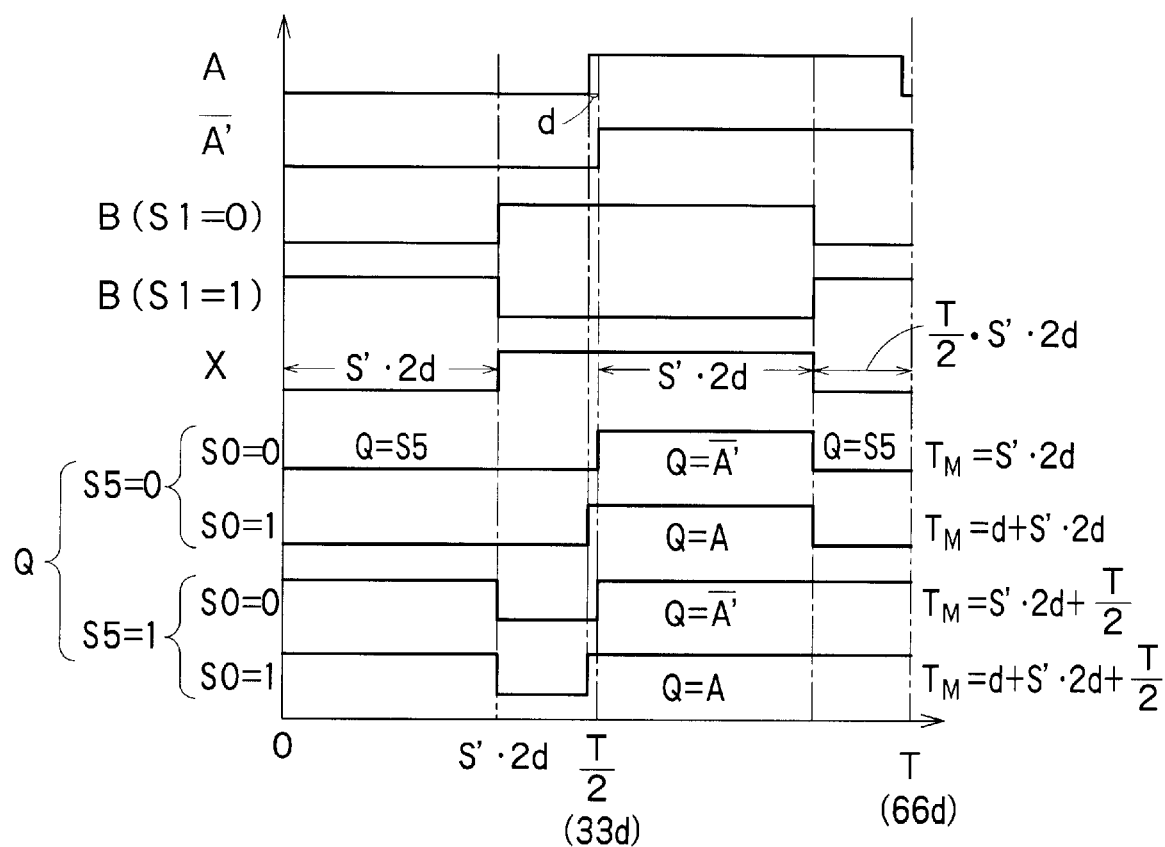
FIG. 25 is a logic diagram rearranged from FIGS. 23 and 24.
FIG. 26 is a timing chart of a pulse width modulation waveform circuit according to the fifth embodiment shown in FIG. 16.

The logical diagram of FIG. 24 can be rearranged as FIG. 25. When the bit S0 of the digital signal is "0", PWM signals are generated by selecting either of the bit S5 or the inverting signal of the output A' from the NAND gate G1 in accordance with the bit S1 and the logic of the output B of the multiplexer 2b. When the bit S0 of the digital signal is "1", PWM signals are generated by selecting either of the bit S5 or the output A from the ring oscillator 1b in accordance with the bit S1 and the logic of the output B of the multiplexer 2b.

A circuit based on FIG. 25 turns out as shown in FIG. 16. The multiplexer 2b of FIG. 16 selects one of signals inputted to inverters of respective stages in the ring oscillator 1b, in accordance with the logic of the bits S1 through S4 of the digital signal. The EXOR gate 21 operates the exclusive logical sum of the output B from the multiplexer 2b and the bit S1 of the digital signal. The multiplexer 22a selects one of the bit S5, output A' of the NAND gate G1 and output A of the ring oscillator 1b in accordance with logic of the bit S0 of the digital signal and the output from the EXOR gate 21, and generates a PWM signal therefrom.

FIG. 26 is a timing chart of the pulse width modulation waveform circuit according to the fifth embodiment shown in FIG. 16. Explained below are behaviors of the circuit of FIG. 16 with reference to the timing chart of FIG. 26.

The circuit of FIG. 16 is designed so that the signal propagation delay time of each inverter means IV1 in the ring oscillator 1b be twice the signal propagation delay time of the NAND gate G1. The signal propagation delay time can be adjusted by appropriately changing channel lengths, channel widths of transistors and lengths of wiring.

The ring oscillator 1b generates a rectangular wave having a period TR at the duty factor of 0.5. Since the ring oscillator 1b is made up of 16 stages inverter means IV1 and one stage of NAND gate G1, the period TR is expressed by Equation (15) shown below:

$$TR = (16 \times 2d + d) \times 2 = 66\,d \quad (15)$$

where d is the signal propagation delay time of the NAND gate G1, and 2d is the signal propagation delay time of each inverter means IV1 in the ring oscillator 1b. The inverting signal /A' of the signal A' inputted to the first-stage inverter means IV1 of the ring oscillator 1b delays from the final-stage output A of the ring oscillator 1b by d, and the output B of the multiplexer 2b delays from the signal /A' by S'·2d. S' is the value of the digital signal S1~S4 of the multiplexer 2b, which is expressed by Equation (16) shown below:

$$S' = S1 + S2 \times 2 + S3 \times 2^2 + S4 \times 2^3 \quad (16)$$

The value N of all of the digital signal S0~S5 is expressed by Equation (17) shown below:

$$N = S0 + S1 \times 2 + S2 \times 2^2 + S3 \times 2^3 + S4 \times 2^4 + S5 \times 2^5 \quad (17)$$

Output X from EXOR 21 in FIG. 16 always delays from the final-stage output A of the ring oscillator 1b by more than a half cycle. From Equations (15) through (17), pulse width TH of the PWM signal Q outputted from the multiplexer 2b becomes as Equation (18) below:

$$TH = S0 \times d + S' \times 2d + S5 \times T/2 \quad (18)$$

$$= (S0 + S1 \times 2 + S2 \times 4 + S3 \times 8 + S4 \times 16 + S5 \times 32) \times d$$

$$= \begin{cases} N \times d & \text{for } N \le 31 \\ N \times d & \text{for } N \ge 32 \end{cases}$$

From Equations (17) and (18), the duty factor becomes as Equation (19) below:

$$D = TH/TR \quad (19)$$

$$= \begin{cases} N/66 & \text{for } N \le 31 \\ (N+1)/66 & \text{for } N \ge 32 \end{cases}$$

As explained above, since the fifth embodiment constitutes the ring oscillator 1b by serially connecting 16 stages of inverter means IV1 and inputs the output from the final-stage inverter means IV1 to the first-stage inverter means IV1 via the NAND gate G1 having a delay time corresponding to one half the signal propagation delay time of the inverter means IV1, it is possible to generate 32 kinds of PWM signal by using the output of the ring oscillator 1b as the reference and 32 kinds of PWM signal by using the output of the NAND gate G1 as the reference, to thereby generate 64 kinds of PWM signal in total. Therefore, the circuit can be more reduced in size and power consumption than the first embodiment.

Other Embodiments

All of the foregoing embodiments have been explained as the signal propagation delay time of the final-stage output A of the ring oscillator being equal to the signal propagation delay time of the output B from the multiplexer. However, since the multiplexer is constituted by a plurality of stages of gates, it is predicted that the signal propagation delay time of the output B becomes larger than the signal propagation delay time of the output A.

As far as the oscillation frequency of the ring oscillator is low, such a difference in delay time is not immaterial. However, if the oscillation frequency is high, adjustment in delay time is required.

FIG. 27 is a block diagram showing an example adding a delay circuit 31 to the circuit of the third embodiment shown in FIG. 7. With the delay circuit 31, the final-stage output A of the ring oscillator 1 can be delayed to allow the signal propagation delay time of the output A and the signal propagation delay time of the output B to be approximately equal. As a result, even when the oscillation frequency of the ring oscillator 1 is high, likeliness of erroneous operation is removed.

In the foregoing embodiments, an inverter is connected between every adjacent terminals of the multiplexer. However, as shown in FIG. 28, three or any larger odd number of inverters may be connected between every adjacent input terminals. By connecting odd pieces of the inverters between an adjacent input terminals, each output signal of each inverting means changes sharply; as a result, it is possible to prevent increase of power consumption of the multiplexer. The number of inverters to be connected between every adjacent terminals may be determined, by taking the manufacturing process, oscillation frequency, and so on, into consideration.

Even in the circuit of the prior art shown in FIG. 1, each of two inverters constituting each buffer may be replace with three or any larger odd number of inverters to reduce power consumption in the multiplexer. In such case, because each buffer is constituted by six or more inverters, the circuit shown in FIG. 28 is still smaller in its area than the above-modified circuit of the prior art.

The foregoing embodiments have been explained as serially connecting 32 stages of inverter means IV1 or serially connecting 16 stages of such inverters. However, the number of stages of inverter means IV1 need not be limited specifically, for example, 32 kinds of PWM signals may be generated by using a ring oscillator 1 serially connecting eight stages of inverter means IV1.

Any circuit other than the circuits shown in FIG. 10 and FIG. 16 is acceptable as the circuit of the present invention, provided it can realize the logic of FIG. 14 or FIG. 25.

Furthermore, instead of using the ring oscillator, an external clock signal may be inputted to the first-stage inverter in an inverter delay circuit made up of a plurality of serially connected inverters, as shown in FIG. 29. In the circuit of FIG. 29, the number of stages of inverters and delay time of each inverter are adjusted so that the clock signal inputted to the first-stage inverter and the clock signal output from the final-stage inverter are shifted in phase by a half cycle approximately.

What is claimed is:

1. A pulse width modulation waveform generating circuit for generating $2^n$ kinds of pulse width modulation signals having different pulse widths in accordance with a digital signal of n (n is an integer equal to or more than 2) bits, comprising;

oscillating signal output means for having m (m is an odd number more than 2) pieces of first inverting means connected in series to each other, each of these first inverting means outputting an oscillating signal with a phase different from each other, the output of said first inverting means at the last stage of the series connected first inverting means being fed back to the input side of the first inverting means at the initial stage of the series connected first inverting means;

selecting means for selecting one of the signals in accordance with each of the output signals of said m pieces of first inverting means connected in series, based on at least partial bits of said digital signal of n bits, and pulse generating means for generating said pulse width modulation signal having a pulse width in accordance with the signal selected by said selecting means.

2. The pulse width modulation waveform generating circuit according to claim 1, wherein said first inverting means are odd stages of inverters, and said selecting means have a multiplexer for selecting one of the signals in accordance with each output signal of said m pieces of first inverting means connected in series, based on logic of $k(=\log_2 m)$ bits among said digital signal of n bits.

3. The pulse width modulation waveform generating circuit according to claim 2, wherein said oscillating signal output means is a ring oscillator for allowing the output signal of a final stage of said first inverting means to feed back to an input side of a first stage of said first inverting means.

4. The pulse width modulation waveform generating circuit according to claim 3, wherein said pulse generating means generates one of said pulse width modulation signals having the number as much as that of stages of said first inverter means in said ring oscillator, based on logic of said digital signal.

5. The pulse width modulation waveform generating circuit according to claim 4, wherein said ring oscillator has a plurality of second inverting means connected to output signals of odd numbered stages among said first inverting means, and said selecting means select one of each output signal of even numbered stages of said first inverter means or each output signal of said plurality of second inverting means.

6. The pulse width modulation waveform generating circuit according to claim 4, wherein said pulse generating means comprises a first edge detecting circuit for outputting an edge detecting pulse by detecting rising edges and falling edges of outputs of said ring oscillator, a second edge detecting circuit for outputting an edge detecting pulse by detecting rising edges and falling edges of outputs of said selecting means, and a set-reset circuit for being set at time when the edge detecting pulse is outputted from said first edge detecting circuit and being reset at time when the edge detecting pulse is outputted from said second edge detecting circuit, and said pulse width modulation signal is outputted from said set-reset circuit.

7. The pulse width modulation waveform generating circuit according to claim 4, wherein said pulse generating means comprises a inversion/non-inversion setting circuit for setting whether or not the output of said selecting means should be reversed, and said pulse generating means generates said pulse width modulation signal having a pulse width in accordance with an output timing of the final stage of said first inverting means in said ring oscillator and an output timing of said inversion/non-inversion setting circuit.

8. The pulse width modulation waveform generating circuit according to claim 7, wherein said pulse generating means generates said pulse width modulation signal by inverting the output of said selecting means by means of said inversion/non-inversion setting circuit when said selecting means selects the output signals of odd stages of said first inverting means, and generates said pulse width modulation signal without inverting the output of said selecting means by means of said inversion/non-inversion setting circuit when said selecting means selects the output signal of even stages of said first inverting means in said ring oscillator.

9. The pulse width modulation waveform generating circuit according to claim 4, wherein said selecting means select the output signal of either even stages or odd stages of said first inverter means in said ring oscillator based on logic of the most significant bit of said digital signal, and select the output signal of a specific inverting means among the output signal of said selected inverting means based on logic of bits except for the most significant bit of said digital signal.

10. The pulse width modulation waveform generating circuit according to claim 9, wherein said selecting means select one of the output signals of even numbered stages of said first inverting means by judging that the signal is delaying more than a half cycle for the output of said ring oscillator when the most significant bit of said digital signal is "1".

11. The pulse width modulation waveform generating circuit according to claim 3, wherein said pulse generating means generate one of said pulse width modulating signals having twice the number of stages as that of said first inverting means in said ring oscillator based on logic of said digital signal.

12. The pulse width modulation waveform generating circuit according to claim 11,
wherein said pulse generating means comprises a inversion/non-inversion setting circuit for setting whether or not the output of said selecting means should be reversed based on logic of the least significant bit of said digital signal, and
said pulse generating means generates said pulse width modulation signal having a pulse width in accordance with an output timing of the final stage of said first inverting means in said ring oscillator and an output timing of said inversion/non-inversion setting circuit.

13. The pulse width modulation waveform generating circuit according to claim 12,
wherein said pulse generating means generates said pulse width modulation signal by inverting the output of said selecting means by means of said inversion/non-inversion setting circuit when said selecting means selects the output signals of odd stages of said first inverting means, and generates said pulse width modulation signal without inverting the output of said selecting means by means of said inversion/non-inversion setting circuit when said selecting means selects the output signal of even stages of said first inverting means in said ring oscillator.

14. The pulse width modulation waveform generating circuit according to claim 11,
said pulse generating means generates said pulse width modulating signal based on output signal of final stage of said first inverting means and input signals of odd numbered stages of said first inverting means in said ring oscillator when the least significant bit of said digital signal is "0", and generates said pulse width modulating signal based on output signal of final stage of said first inverting means and input signals of even numbered stages of said first inverting means in said ring oscillator when the least significant bit of said digital signal is "1".

15. The pulse width modulation waveform generating circuit according to claim 14,
wherein said selecting means select one of input signals of said first inverting means in said ring oscillator based on logic of the most significant bit of said digital signal, and
said pulse generating means generate said pulse width modulating signal by selecting one of the output signal of final stage of said first inverting means in said ring oscillator or the most significant bit of said digital signal.

16. The pulse width modulation waveform generating circuit according to claim 3,
wherein said pulse generating means generate one of said pulse width modulating signals having fourth the number of stages as that of said first inverting means in said ring oscillator based on logic of said digital signal.

17. The pulse width modulation waveform generating circuit according to claim 16,
wherein said pulse generating means comprises a inversion/non-inversion setting circuit for setting whether or not the output of said selecting means should be reversed, and said pulse generating means generates said pulse width modulation signal having a pulse width in accordance with an output timing of the final stage of said first inverting means in said ring oscillator and an output timing of said inversion/non-inversion setting circuit.

18. The pulse width modulation waveform generating circuit according to claim 17,
wherein said pulse generating means generates said pulse width modulation signal by inverting the output of said selecting means by means of said inversion/non-inversion setting circuit when said selecting means selects the output signals of odd stages of said first inverting means, and generates said pulse width modulation signal without inverting the output of said selecting means by means of said inversion/non-inversion setting circuit when said selecting means selects the output signal of even stages of said first inverting means in said ring oscillator.

19. The pulse width modulation waveform generating circuit according to claim 16,
wherein said ring oscillator includes an logic inverting means for inputting to the first stage of said first inverter means by inverting output signal of final stage of said first inverter means, and
said ring oscillator sets a signal propagation delay time of said logic inverting means to a half the signal propagation delay time by one stage of said plurality of first inverter means.

20. The pulse width modulation waveform generating circuit according to claim 19,
wherein said selecting means select one of input signals of said first inverting means in said ring oscillator based on logic except for the most significant bit and the least significant bit of said digital signals, and
said pulse generating means generate said pulse width modulating signal by selecting one of the output signal of final stage of said first inverting means in said ring oscillator, output signal of said logic inverting means, and the most significant bit of said digital signal.

21. The pulse width modulation waveform generating circuit according to claim 19,
said pulse generating means generates a bit next to the least significant bit of said digital signal, output signal of said selecting means, the most significant bit of said digital signal, and output signal of said logic inverting means when the least significant bit of said digital signal is "0", and generates said pulse width based on a bit next to the least significant bit of said digital signal, output signal of said selecting means, the most significant bit of said digital signal, and output signal of final stage of said first inverter means in said ring oscillator.

22. The pulse width modulation waveform generating circuit according to claim 2,
wherein an oscillating signal from outside is inputted to first stage of said first inverter means among m pieces of said first inverter means connected in series, and
a value of said m and a signal propagation delay time of said first inverter means are set so that a phase difference between an oscillating signal inputted to first stage of said first inverter means and final stage of said first inverter means is substantially 180°.

* * * * *